(12) United States Patent
Matsukawa

(10) Patent No.: US 10,992,258 B2
(45) Date of Patent: Apr. 27, 2021

(54) OSCILLATOR, ELECTRONIC APPARATUS, AND VEHICLE

(71) Applicant: SEIKO EPSON CORPORATION, Tokyo (JP)

(72) Inventor: Norihito Matsukawa, Shimosuwa-Machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 16/796,539

(22) Filed: Feb. 20, 2020

(65) Prior Publication Data

US 2020/0274487 A1 Aug. 27, 2020

(30) Foreign Application Priority Data

Feb. 22, 2019 (JP) .............................. JP2019-030233

(51) Int. Cl.
| | | |
|---|---|---|
| *G01N 27/00* | (2006.01) | |
| *G08B 19/00* | (2006.01) | |
| *G08B 21/00* | (2006.01) | |
| *H03B 5/04* | (2006.01) | |
| *H03H 9/05* | (2006.01) | |
| *H03H 9/19* | (2006.01) | |
| *H03B 5/30* | (2006.01) | |
| *B60R 16/023* | (2006.01) | |
| *H03H 9/10* | (2006.01) | |

(52) U.S. Cl.
CPC ........... *H03B 5/04* (2013.01); *B60R 16/0231* (2013.01); *H03B 5/30* (2013.01); *H03H 9/0533* (2013.01); *H03H 9/0557* (2013.01); *H03H 9/1021* (2013.01); *H03H 9/19* (2013.01); *H03B 2200/0018* (2013.01)

(58) Field of Classification Search
CPC .... H03B 5/04; H03B 5/30; H03B 2200/0018; H03H 9/0533; H03H 9/0557; H03H 9/19; H03H 9/1021; B60R 16/0231
USPC .......................................................... 331/66
See application file for complete search history.

(56) References Cited

U.S. PATENT DOCUMENTS

| | | | | |
|---|---|---|---|---|
| 9,484,928 B2 * | 11/2016 | Isohata | ................... | H03L 1/028 |
| 2014/0292151 A1 | 10/2014 | Kondo | | |
| 2017/0230003 A1 * | 8/2017 | Kikuchi | ................... | H03H 9/10 |
| 2017/0373693 A1 * | 12/2017 | Kondo | ...................... | H03L 1/04 |

FOREIGN PATENT DOCUMENTS

| | | |
|---|---|---|
| JP | 2014-192674 A | 10/2014 |
| JP | 2018-026611 A | 2/2018 |

* cited by examiner

*Primary Examiner* — Richard Tan
(74) *Attorney, Agent, or Firm* — Workman Nydegger

(57) ABSTRACT

An oscillator includes: a base substrate having a first electrode; a temperature control element mounted on the base substrate and having a first pad electrically coupled to the first electrode; a resonator element having a first major surface and a second major surface in front-back relation with the first major surface, and mounted on the temperature control element in such a way that the second major surface faces the temperature control element; and at least one first bonding wire coupling the first major surface and the first pad together.

10 Claims, 17 Drawing Sheets

ND VEHICLE

The present application is based on, and claims priority from JP Application Serial Number 2019-030233, filed Feb. 22, 2019, the disclosure of which is hereby incorporated by reference herein in its entirety.

BACKGROUND

1. Technical Field

The present disclosure relates to an oscillator, an electronic apparatus, and a vehicle.

2. Related Art

For example, JP-A-2014-192674 discloses a resonator device including a base substrate, a heat generation unit installed at the base substrate, a resonator element installed at the heat generation unit, and a support unit supporting the resonator element at a different position from the heat generation unit. As the area of the coupling part between the resonator element and the heat generation unit is made larger than the contact area between the resonator element and the support unit, heat is efficiently transferred from the heat generation unit to the resonator element and heat escape from the resonator element to the support unit is reduced. Thus, the temperature of the resonator element is stabilized.

In the resonator device disclosed in JP-A-2014-192674, an electrode arranged at the base substrate and an electrode of the resonator element are directly electrically coupled together by a bonding wire. Since there is a temperature difference between the heat generation unit and the base substrate, heat is transferred between the resonator element and the base substrate via the bonding wire. This may destabilize the temperature of the resonator element.

SUMMARY

An oscillator according to an application example of the present disclosure includes: a base substrate having a first electrode; a temperature control element installed at the base substrate and having a first pad electrically coupled to the first electrode; a resonator element having a first major surface and a second major surface in front-back relation with the first major surface, and installed at the temperature control element in such a way that the second major surface faces the temperature control element; and at least one first bonding wire coupling the first major surface and the first pad together.

The oscillator according to the application example of the present disclosure may further include at least one second bonding wire electrically coupling the first pad and the first electrode together.

In the oscillator according to the application example of the present disclosure, a number of the second bonding wires may be fewer than a number of the first bonding wires.

In the oscillator according to the application example of the present disclosure, the temperature control element may have a second pad, and the second major surface may be bonded to the second pad via an electrically conductive bonding member.

In the oscillator according to the application example of the present disclosure, the temperature control element may have a third pad arranged between the first pad and the second pad, as viewed in a plan view, and to which a constant voltage is applied.

In the oscillator according to the application example of the present disclosure, the first pad may have a larger area than the third pad, as viewed in a plan view.

In the oscillator according to the application example of the present disclosure, the temperature control element may further include: a temperature-sensitive element; a third pad to which a high potential-side power supply voltage is applied; a fourth pad to which a low potential-side power supply voltage is applied; a fifth pad outputting a signal from the temperature-sensitive element; and a sixth pad to which a control voltage is applied. One of the third pad, the fourth pad, and the fifth pad may be arranged between the first pad and the sixth pad, as viewed in a plan view. One of the third pad, the fourth pad, and the fifth pad may be arranged between the second pad and the sixth pad, as viewed in a plan view.

The oscillator according to the application example of the present disclosure may further include a second temperature control element installed at the base substrate. The resonator element may overlap the second temperature control element at a position not overlapping the temperature control element, as viewed in a plan view.

An oscillator according to another application example of the present disclosure includes: a base substrate having a first electrode; a temperature control element installed at the base substrate and having a first pad electrically coupled to the first electrode; a resonator including a resonator element and a container that accommodates the resonator element, the resonator having a first terminal at a first surface, the resonator being installed at the temperature control element at the side of a second surface in a front-back relation with the first surface; and at least one bonding wire coupling the first terminal and the first pad together.

An electronic apparatus according to still another application example of the present disclosure includes: the above oscillator; and a signal processing circuit performing signal processing based on an output signal from the oscillator.

A vehicle according to still another application example of the present disclosure includes: the above oscillator; and a signal processing circuit performing signal processing based on an output signal from the oscillator.

DESCRIPTION OF EXEMPLARY EMBODIMENTS

Preferred embodiments of the oscillator, the electronic apparatus, and the vehicle according to the present disclosure will now be described in detail with reference to the accompanying drawings.

First Embodiment

Figure 1:
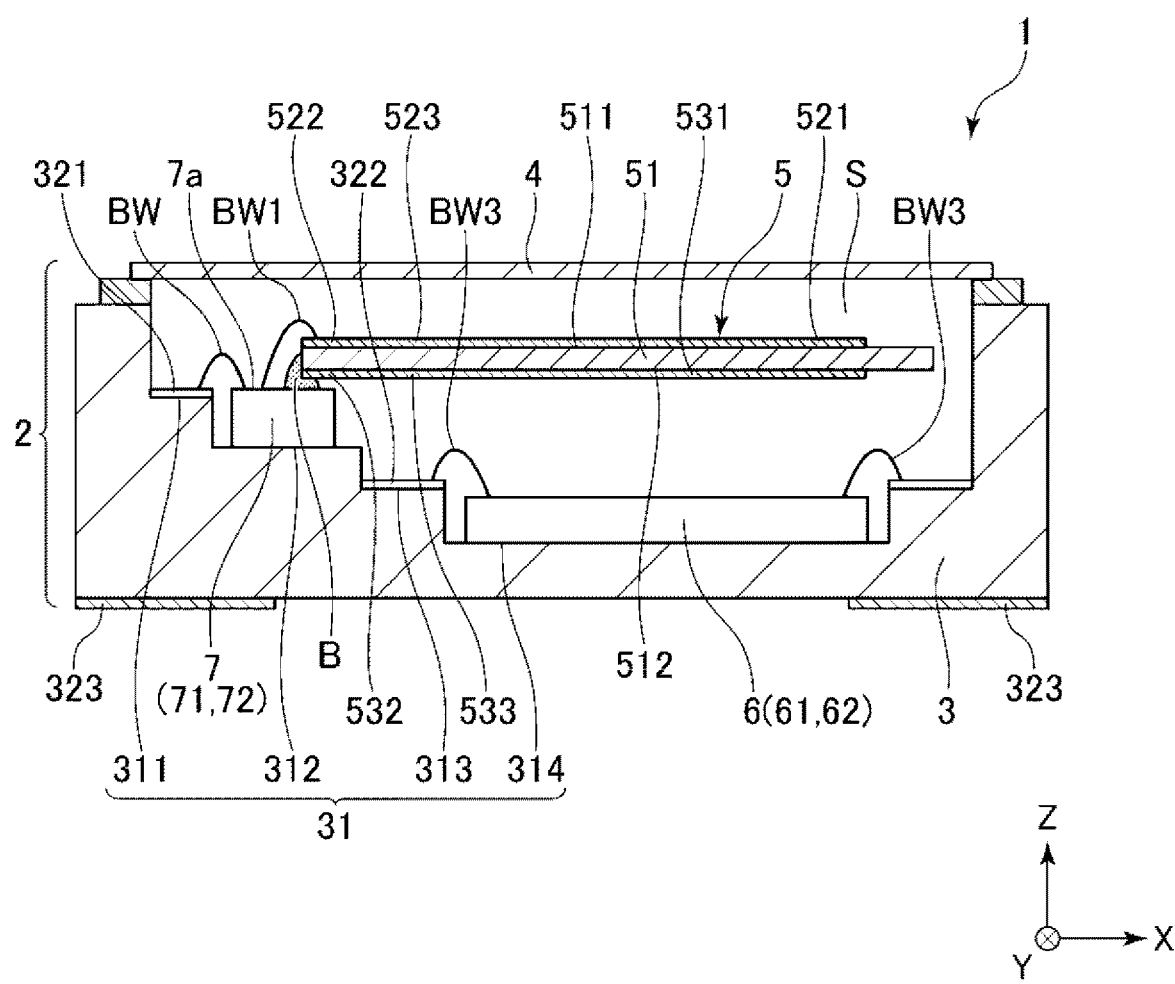
FIG. 1 is a cross-sectional view showing an oscillator according to a first embodiment.
Figure 2:
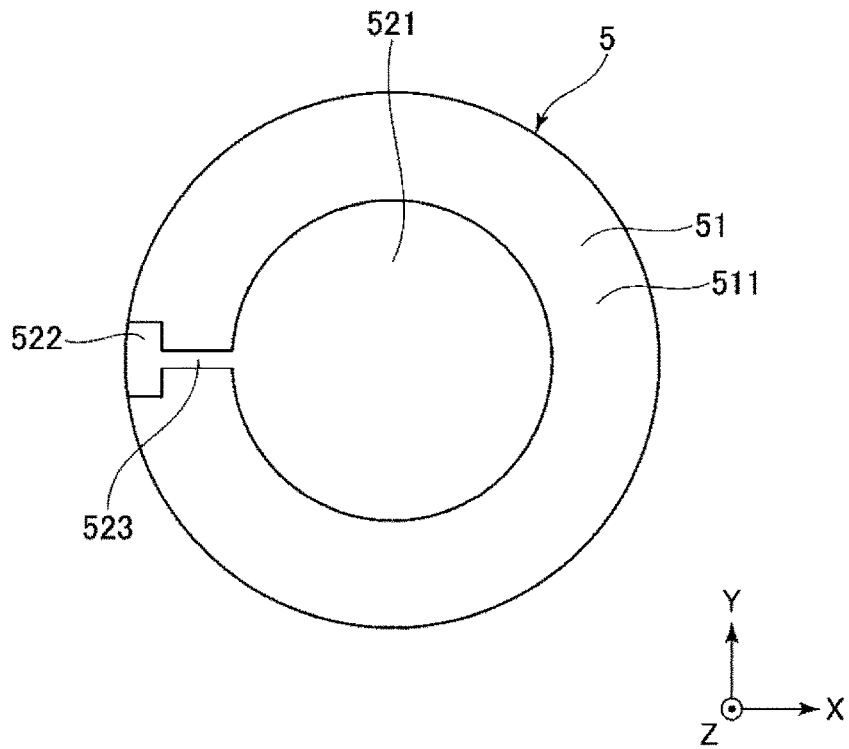
FIG. 2 is a plan view showing an upper surface of a resonator element, as viewed from the top side in FIG. 1.
Figure 3:
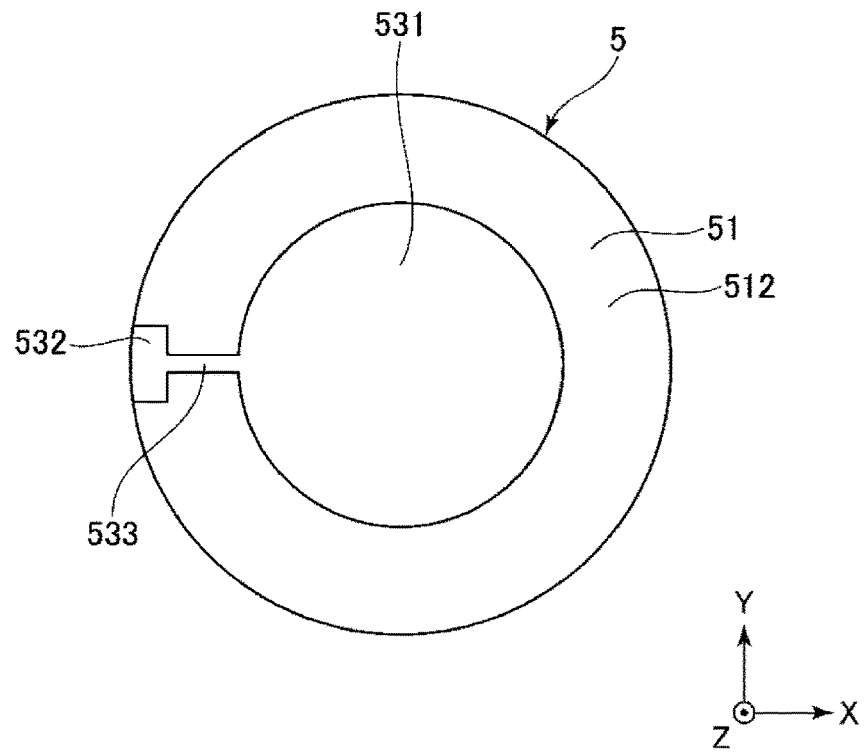
FIG. 3 is a perspective view showing a lower surface of the resonator element, as viewed from the top side in FIG. 1.
Figure 4:
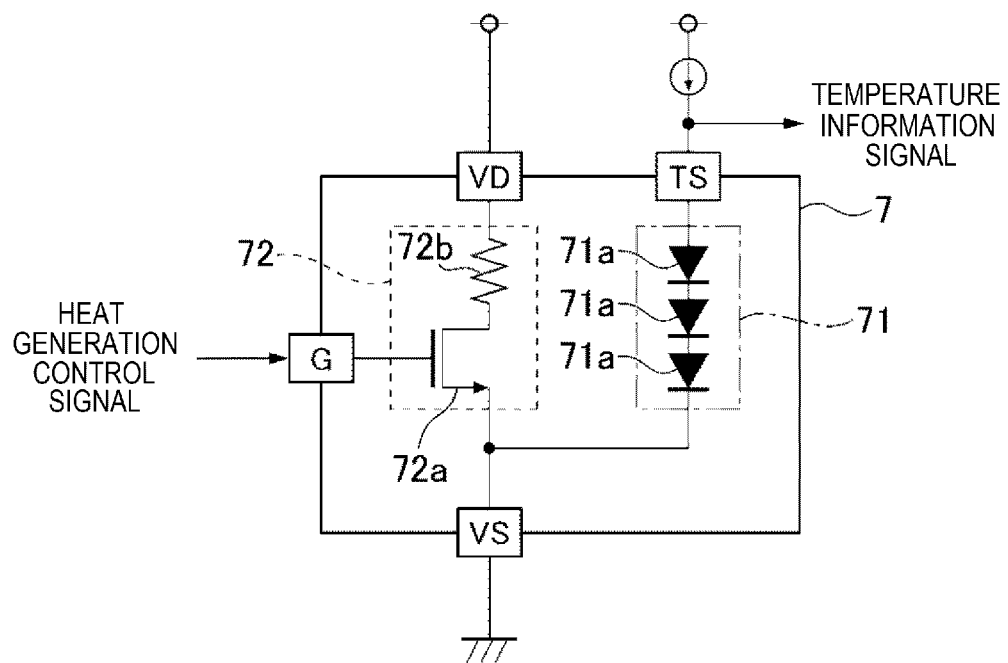
FIG. 4 is a circuit diagram showing an example of the circuit configuration of a temperature control element.
Figure 5:
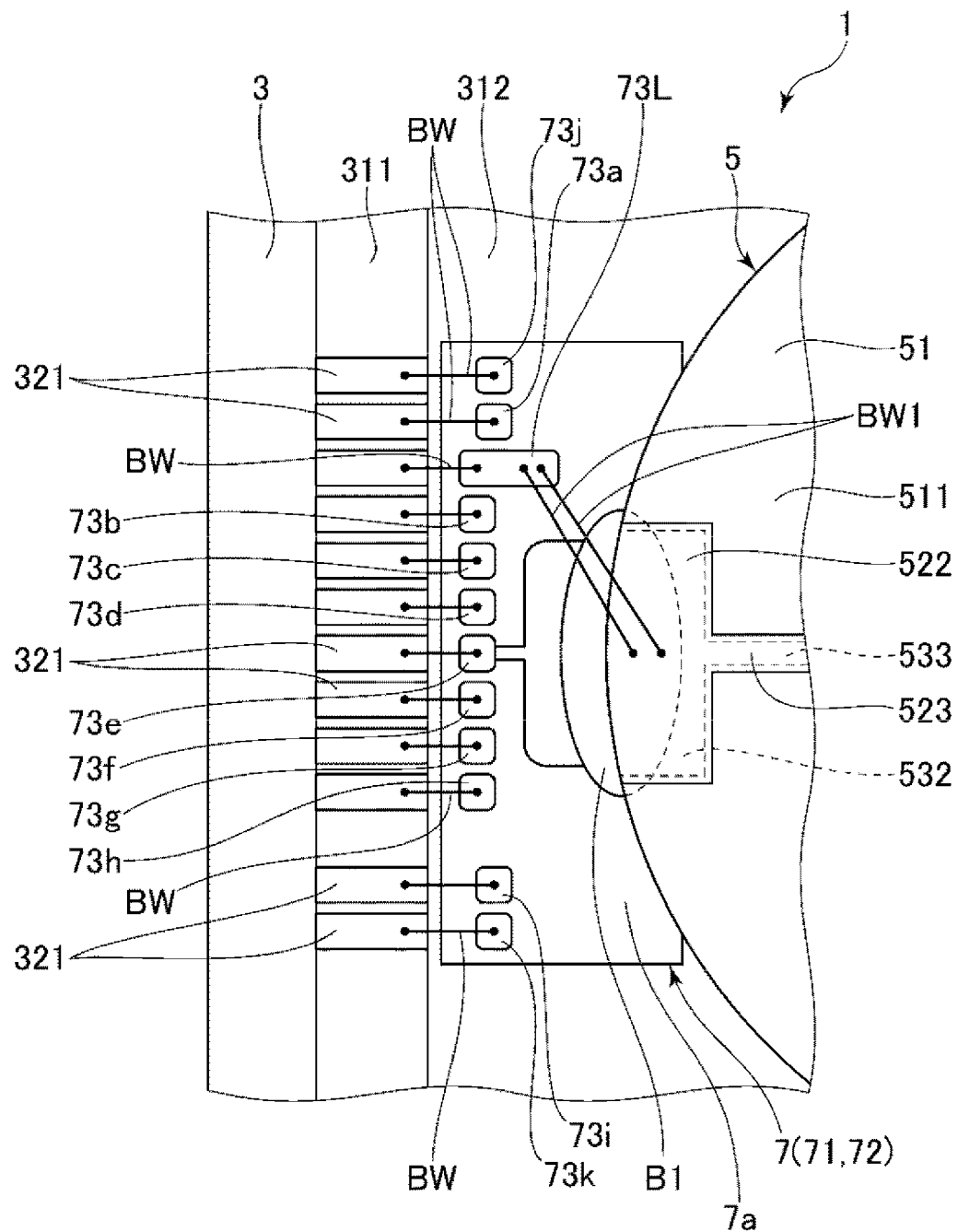
FIG. 5 is a plan view showing an upper surface of the temperature control element.

FIG. 1 is a cross-sectional view showing an oscillator according to a first embodiment. FIG. 2 is a plan view showing an upper surface of a resonator element, as viewed from the top side in FIG. 1. FIG. 3 is a perspective view showing a lower surface of the resonator element, as viewed from the top side in FIG. 1. FIG. 4 is a circuit diagram showing an example of the circuit configuration of a temperature control element. FIG. 5 is a plan view showing an upper surface of the temperature control element. For the sake of convenience of the description, an X-axis, a Y-axis, and a Z-axis orthogonal to each other are shown in each illustration. In the description below, the positive side on the Z-axis is referred to as "up" and the negative size on the Z-axis is referred to as "down". Also, when something is viewed in a plan view along the Z-axis, it is referred to simply as being "viewed in a plan view".

An oscillator 1 shown in FIG. 1 is an OCXO (oven-controlled crystal oscillator). The oscillator 1 has: a package 2; and a resonator element 5, a circuit element 6, and a temperature control element 7 accommodated in the package 2. The circuit element 6 includes an oscillation circuit 61 and a temperature control circuit 62. The temperature control element 7 includes a temperature sensor 71 and a heat generation circuit 72.

The package 2 has a base substrate 3 having a recess part 31 opening at an upper surface, and a lid 4 bonded to the upper surface of the base substrate 3 in such a way as to close the opening of the recess part 31. The recess part 31 has a first recess part 311 opening at the upper surface of the base substrate 3, a second recess part 312 opening at a bottom surface of the first recess part 311, a third recess part 313 opening at a bottom surface of the second recess part 312, and a fourth recess part 314 opening at a bottom surface of the third recess part 313. The temperature control element 7 is installed at the bottom surface of the second recess part 312. The resonator element 5 is installed at the temperature control element 7 via an electrically conductive bonding member B. The circuit element 6 is installed at a bottom surface of the fourth recess part 314.

At the bottom surface of the first recess part 311 of the base substrate 3, a plurality of internal terminals 321 are arranged. At the bottom surface of the third recess part 313, a plurality of internal terminals 322 are arranged. At the lower surface of the base substrate 3, a plurality of external terminals 323 are arranged. Some of the plurality of internal terminals 322 are electrically coupled to the internal terminals 321 via an internal wiring, not illustrated, formed inside the base substrate 3. Some of the rest of the internal terminals 322 are electrically coupled to the external terminals 323 via the internal wiring. Each of the plurality of internal terminals 321 is electrically coupled to the temperature control element 7 via a bonding wire BW. Each of the plurality of internal terminals 322 is electrically coupled to the circuit element 6 via a bonding wire BW3.

The resonator element 5 is attached to an upper surface 7a of the temperature control element 7 via the electrically conductive bonding member B. In this embodiment, an SC-cut quartz crystal resonator element having excellent frequency stability is used as the resonator element 5. As shown in FIGS. 2 and 3, the resonator element 5 has: an SC-cut disk-like quartz crystal substrate 51; a first excitation electrode 521, a first coupling electrode 522, and a first extraction electrode 523 coupling the first excitation electrode 521 and the first coupling electrode 522 together, which are arranged at an upper surface 511 of the quartz crystal substrate 51; and a second excitation electrode 531 arranged opposite the first excitation electrode 521, a second coupling electrode 532 arranged opposite the first coupling electrode 522, and a second extraction electrode 533 coupling the second excitation electrode 531 and the second coupling electrode 532 together, which are arranged at a lower surface 512 of the quartz crystal substrate 51.

However, the configuration of the resonator element 5 is not limited to this. For example, the shape of the quartz crystal substrate 51 as viewed in a plan view is not limited to a circle and may be, for example, a rectangle. The resonator element 5 may also be an AT-cut quartz crystal resonator element, BT-cut quartz crystal resonator element, tuning fork-type quartz crystal resonator element, elastic surface wave resonator, other piezoelectric resonator elements, MEMS (microelectromechanical systems) resonator element, or the like.

Such a resonator element 5 is attached to the upper surface of the temperature control element 7 via the electrically conductive bonding member B in an attitude such that the lower surface 512 faces the side of the temperature control element 7, as shown in FIG. 1.

As shown in FIG. 1, the circuit element 6 has the oscillation circuit 61 and the temperature control circuit 62. The oscillation circuit 61 is coupled to both ends of the resonator element 5, that is, the first and second coupling electrodes 522, 532. The oscillation circuit 61 is a circuit for amplifying a signal outputted from the resonator element 5, then feeding the amplified signal back to the resonator element 5, and thus causing the resonator element 5 to oscillate. The circuit formed by the resonator element 5 and the oscillation circuit 61 is, for example, a Pierce oscillator circuit, inverter oscillator circuit, Colpitts oscillator circuit, Hartley oscillator circuit, or the like.

The temperature control circuit 62 is a circuit for controlling the amount of current flowing through a resistor of the heat generation circuit 72, based on an output signal from the temperature sensor 71, and thus maintaining the resonator element 5 at a constant temperature. For example, the temperature control circuit 62 performs control in such a way that a desired current flows through the resistor of the heat generation circuit 72 when the current temperature determined from the output signal from the temperature sensor 71 is lower than a set reference temperature, whereas no current flows through the resistor of the heat generation circuit 72 when the current temperature is equal to or higher than the reference temperature. The temperature control circuit 62 may also perform control, for example, in such a way as to increase or decrease the amount of current flowing through the resistor of the heat generation circuit 72 according to the difference between the current temperature and the reference temperature.

As shown in FIG. 1, the temperature control element 7 has the temperature sensor 71 and the heat generation circuit 72. Of these, the temperature sensor 71 has the function of a temperature detection unit detecting its ambient temperature, particularly the temperature of the resonator element 5. The heat generation circuit 72 has the function of a heat generation unit heating the resonator element 5.

FIG. 4 shows an example of the circuit configuration of the temperature control element 7. As shown in FIG. 4, the heat generation circuit 72 has a configuration in which a resistor 72a and a MOS transistor 72b are coupled in series between a power supply terminal VD and a grounding terminal VS. A heat generation control signal outputted from the temperature control circuit 62 is inputted to a gate of the MOS transistor 72b via an input terminal G. The current flowing through the resistor 72a is controlled, based on the heat generation control signal, and the amount of heat generated at the resistor 72a is thus controlled. The temperature sensor 71 has a configuration in which one or a plurality of diodes 71a are coupled in series in a forward direction between an output terminal TS and the grounding terminal VS. A constant current from a constant current source provided at the temperature control circuit 62 is supplied to the output terminal TS. Thus, a constant forward current flows through the diode 71a. When the constant forward current flows through the diode 71a, the voltage at both ends of the diode 71a changes substantially linearly with respect to temperature change. Therefore, the voltage at the output terminal TS is linear with respect to temperature. Thus, a signal outputted from the output terminal TS can be used as a temperature information signal.

As shown in FIG. 5, the temperature control element 7 has a plurality of electrode pads 73a, 73b, 73c, 73d, 73e, 73f, 73g, 73h, 73i, 73j, 73k, 73L arranged on the upper surface 7a. The electrode pads 73a to 73L are arrayed along an outer edge of the temperature control element 7, as viewed in a plan view. In the illustrated example, the outer edge of the temperature control element 7 is a rectangle, as viewed in a plan view. The electrode pads 73a to 73L are arrayed along one side of the rectangle. Each of the electrode pads 73a to 73L is electrically coupled via the bonding wire BW to the internal terminal 321 arranged at the base substrate 3.

The electrode pads 73a, 73i function as the power supply terminal VD shown in FIG. 4. The electrode pads 73b, 73c, 73d, 73f, 73g, 73h function as the grounding terminal VS shown in FIG. 4. The electrode pad 73j functions as the output terminal TS shown in FIG. 4. The electrode pad 73k functions as the input terminal G shown in FIG. 4.

The electrode pads 73e, 73L are not electrically coupled to the temperature sensor 71 and the heat generation circuit 72 and function as relay electrodes for electrically coupling the internal terminal 321 and the resonator element 5 together. The electrode pad 73e is electrically coupled to the second coupling electrode 532 of the resonator element 5 via the electrically conductive bonding member B. Thus, the internal terminal 321 and the second coupling electrode 532 are electrically coupled together via the bonding wire BW, the electrode pad 73e, and the bonding member B. Meanwhile, the electrode pad 73L is electrically coupled to the first coupling electrode 522 of the resonator element 5 via a bonding wire BW1. Thus, the internal terminal 321 and the first coupling electrode 522 are electrically coupled together via the bonding wire BW1, the electrode pad 73L, and the bonding wire BW.

Since the electrode pads 73e, 73L as relay electrodes are arranged at the temperature control element 7 in this way, the electrical coupling of the internal terminal 321 and the resonator element 5 is made easier. According to the related art, the electrode pad 73L is omitted and the internal terminal 321 and the first coupling electrode 522 are directly coupled together by the bonding wire BW1. However, using the electrode pad 73L as a relay electrode as in this embodiment can achieve the following effects.

That is, there is a thermal resistance between the temperature control element 7 and the base substrate 3 and a temperature difference is generated between them. Therefore, directly coupling the internal terminal 321 and the first coupling electrode 522 by the bonding wire BW1 as in the related art may cause heat transfer between the resonator element 5 and the base substrate 3 via the bonding wire BW1 and thus may destabilize the temperature of the resonator element 5. In contrast, in the embodiment, when the internal terminal 321 and the first coupling electrode 522 are coupled together via the relay of the electrode pad 73L arranged at the temperature control element 7 and heated by the heat generation circuit 72 similarly to the resonator element 5, the heat transfer between the resonator element 5 and the base substrate 3 is restrained, compared with the related-art configuration. Therefore, the temperature of the resonator element 5 becomes stable, and the oscillator 1 where the temperature of the resonator element 5 can be controlled with higher accuracy is provided.

Particularly, the electrode pad 73L and the first coupling electrode 522 are coupled together via a plurality of bonding wires BW1, and in this embodiment, via two bonding wires BW1. This can make the thermal coupling of the temperature control element 7 and the resonator element 5 stronger than when one bonding wire BW1 is used. Therefore, the resonator element 5 can be heated more efficiently by the heat generation circuit 72.

Meanwhile, the electrode pad 73L and the internal terminal 321 are coupled together via one bonding wire BW. That is, the number of the bonding wires BW coupling the electrode pad 73L and the internal terminal 321 together is fewer than the number of the bonding wires BW1 coupling the electrode pad 73L and the first coupling electrode 522 together. Making the number of the bonding wires BW fewer than the number of the bonding wires BW1 in this way can restrain heat transfer between the base substrate 3 and the temperature control element 7.

The respective numbers of the bonding wires BW1, BW are not particularly limited. For example, the number of the bonding wires BW1 may be one or may be three or more. Similarly, the number of the bonding wires BW may be two or more. Also, the number of the bonding wires BW may be the same as the number of the bonding wires BW1 or may be greater than the number of the bonding wires BW1.

Details of the arrangement of the electrode pads 73a to 73L will now be described in detail with reference to FIG. 5. As described above, the electrode pads 73a, 73i are the power supply terminals VD. The electrode pads 73b, 73c, 73d, 73f, 73g, 73h are the grounding terminals VS. The electrode pad 73j is the output terminal TS. The electrode pad 73k is the input terminal G. The electrode pads 73e, 73L are the relay electrodes not electrically coupled to the temperature sensor and the heat generation circuit 72 and provided to electrically couple the internal terminals 321 and the resonator element 5 together.

Of these, the electrode pad 73e is installed at a center part in the longitudinal direction of the upper surface 7a. Next to both sides of the electrode pad 73e, the electrode pads 73b, 73c, 73d, 73f, 73g, 73h are divided into groups of three and arranged symmetrically about the electrode pad 73e. The electrode pad 73a is located on the outside of the electrode pads 73b, 73c, 73d. The electrode pad 73i is located on the outside of the electrode pads 73f, 73g, 73h. The electrode pads 73a, 73i are arranged symmetrically about the electrode pad 73e. The electrode pad 73j is located on the outside of the electrode pad 73a. The electrode pad 73k is located on the outside of the electrode pad 73i. The electrode pads 73j, 73k are arranged symmetrically about the electrode pad 73e. The electrode pad 73L is arranged between the electrode pads 73a, 73b.

Since the electrode pads 73b, 73c, 73d, which are the grounding terminals VS with a constant potential, are thus arranged between the electrode pads 73e, 73L coupled to the resonator element 5, interference between the electrode pads 73e, 73L is restrained and the resonance property of the resonator element 5 becomes stable.

Also, one of the electrode pads 73a, 73i, which are the power supply terminals VD, the electrode pads 73b, 73c, 73d, 73f, 73g, 73h, which are the grounding terminals VS, and the electrode pad 73j, which is the output terminal TS, is arranged between the electrode pad 73L and the electrode pad 73k, which is the input terminal G. In this embodiment, the electrode pad 73i is arranged between the electrode pads 73L, 73k. Also, one of the electrode pads 73a, 73i, which are the power supply terminals VD, the electrode pads 73b, 73c, 73d, 73f, 73g, 73h, which are the grounding terminals VS, and the electrode pad 73j, which is the output terminal TS, is arranged between the electrode pad 73e and the electrode pad 73k, which is the input terminal G. In this embodiment, the electrode pad 73i is arranged between the electrode pads 73e, 73k. Thus, the electrode pads 73e, 73L electrically coupled to the resonator element 5 can be arranged as far away as possible from the electrode pad 73k, to which a signal with a relatively high intensity is inputted. Therefore, interference between the electrode pads 73e, 73L and the electrode pad 73k is restrained and the resonance property of the resonator element 5 becomes stable.

The area of the electrode pad 73L is larger than the area of the other electrode pads 73a, 73b, 73c, 73d, 73e, 73f, 73g, 73h, 73i, 73j, 73k, as viewed in a plan view. Only one bonding wire BW is coupled to the electrode pads 73a, 73b, 73c, 73d, 73e, 73f, 73g, 73h, 73i, 73j, 73k, whereas two bonding wires BW1 and one bonding wire BW are coupled to the electrode pad 73L. Therefore, providing the electrode pad 73L with a large area facilitates coupling of the bonding wires BW1, BW to the electrode pad 73L. Particularly, in this embodiment, the electrode pad 73L has a longitudinal shape. Therefore, by coupling the bonding wires BW1 to one end in the longitudinal direction of the electrode pad 73L and coupling the bonding wire BW to the other end, it is easier to couple these bonding wires to the electrode pad 73L.

The oscillator 1 has been described above. As described above, the oscillator 1 has: the base substrate 3 having the internal terminals 321 as a first electrode; the temperature control element 7 installed at the base substrate 3 and having the electrode pad 73L as a first pad electrically coupled to the internal terminals 321; the resonator element 5 having the upper surface 511 as a first major surface and the lower surface 512 as a second major surface in front-back relation with the upper surface 511, and installed at the temperature control element 7 in such a way that the lower surface 512 faces the temperature control element 7; and at least one bonding wire BW1 as a first bonding wire coupling the upper surface 511 and the electrode pad 73L together. Since the internal terminals 321 and the resonator element 5 are coupled together via the relay of the electrode pad 73L in this way, heat transfer between the resonator element 5 and the base substrate 3 is restrained. Therefore, the temperature of the resonator element 5 becomes stable and the oscillator 1 in which the temperature of the resonator element 5 can be controlled with higher accuracy is provided.

As described above, the oscillator 1 has at least one bonding wire BW as a second bonding wire coupling the electrode pad 73L and the internal terminals 321 together. This facilitates the electrical coupling of the electrode pad 73L and the internal terminals 321. However, the electrical coupling of the electrode pad 73L and the internal terminals 321 may be carried out by other methods than using the bonding wire BW.

As described above, the number of the bonding wires BW is fewer than the number of the bonding wires BW1. This can further reduce the wiring resistance between the electrode pad 73L and the first coupling electrode 522 and can also make the thermal coupling between the temperature control element and the resonator element 5 stronger. Therefore, the resonator element 5 can be more efficiently heated by the heat generation circuit 72 of the temperature control element 7.

As described above, the temperature control element 7 has the electrode pad 73e as a second pad, and the lower surface 512 of the resonator element 5 is bonded to the electrode pad 73e via the electrically conductive bonding member B. Thus, the electrode pad 73e and the resonator element 5 can be electrically coupled together with a simple configuration. Also, since the temperature control element 7 and the resonator element 5 can be thermally coupled together via the bonding member B, the resonator element 5 can be efficiently heated by the temperature control element 7.

As described above, the temperature control element 7 has the electrode pads 73b, 73c, 73d as third pads which are arranged between the electrode pad 73L and the electrode pad 73e, as viewed in a plan view, and to which a constant voltage is applied, and which are grounded in this embodiment. Thus, interference between the electrode pads 73e, 73L is restrained and the resonance property of the resonator element 5 becomes stable.

As described above, the area of the electrode pad 73L is larger than the area of the electrode pads 73b, 73c, 73d, as viewed in a plan view. This facilitates the coupling of the bonding wires BW1, BW to the electrode pad 73L.

As described above, the temperature control element 7 has: the temperature sensor 71 as a temperature-sensitive element; the electrode pad 73i as a third pad to which a high potential-side power supply voltage is applied; the electrode pads 73b, 73c, 73d, 73f, 73g, 73h as fourth pads to which a low potential-side power supply voltage is applied and which are grounded in this embodiment; the electrode pad 73j as a fifth pad outputting a signal from the temperature sensor 71; and the electrode pad 73k as a sixth pad to which a heat generation control signal, which is a control voltage, is applied. One of the electrode pads 73i, 73b, 73c, 73d, 73f, 73g, 73h, 73j is arranged between the electrode pad 73L and the electrode pad 73k, as viewed in a plan view. One of the electrode pads 73i, 73b, 73c, 73d, 73f, 73g, 73h, 73j is arranged between the electrode pad 73e and the electrode pad 73k, as viewed in a plan view. Thus, the electrode pads 73e, 73L electrically coupled to the resonator element 5 can be arranged as far away as possible from the electrode pad 73k, to which a signal with a relatively high intensity is inputted. Therefore, interference between the electrode pads 73e, 73L and the electrode pad 73k is restrained and the resonance property of the resonator element 5 becomes stable.

Second Embodiment

Figure 6:
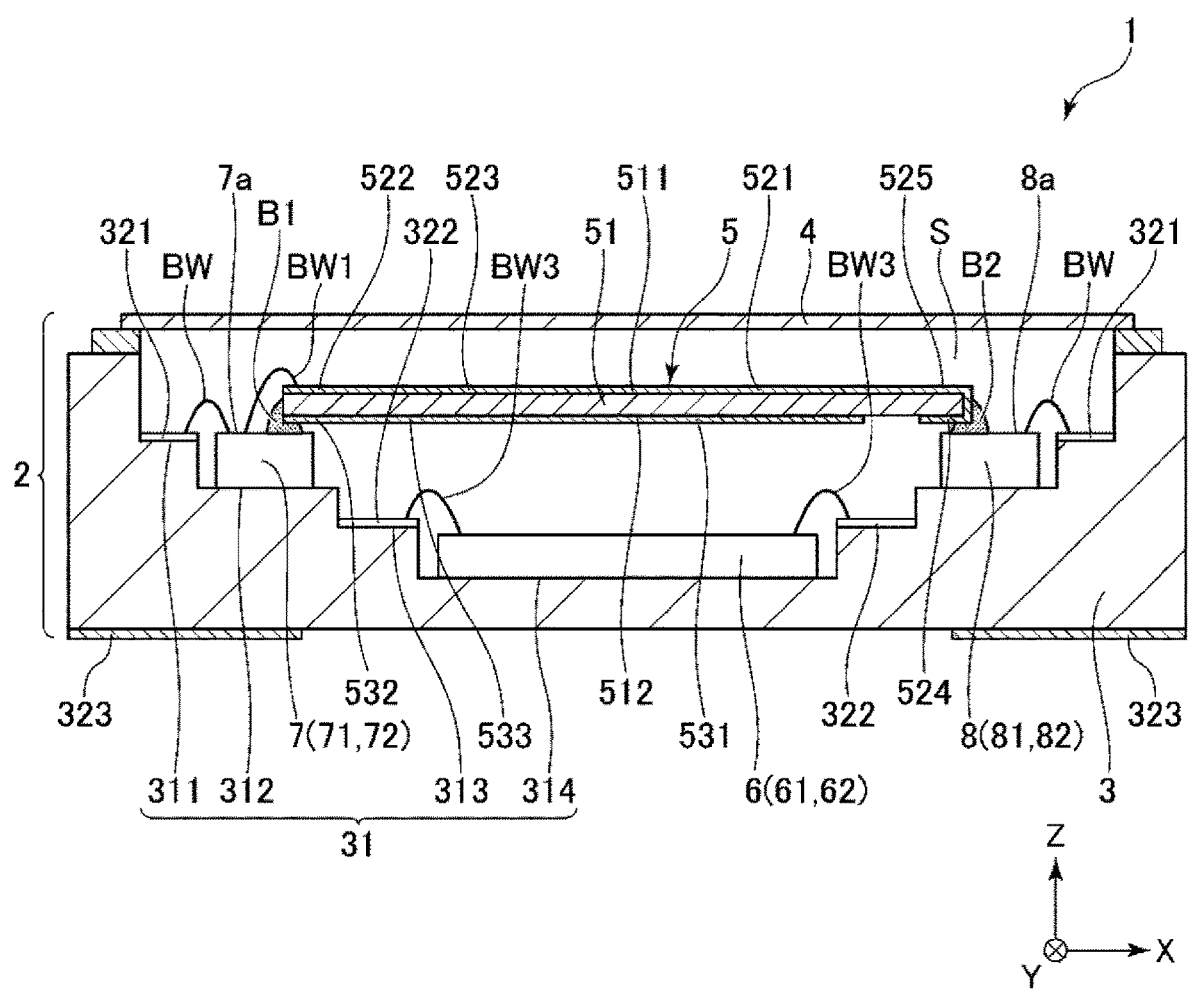
FIG. 6 is a cross-sectional view showing an oscillator according to a second embodiment.
Figure 7:
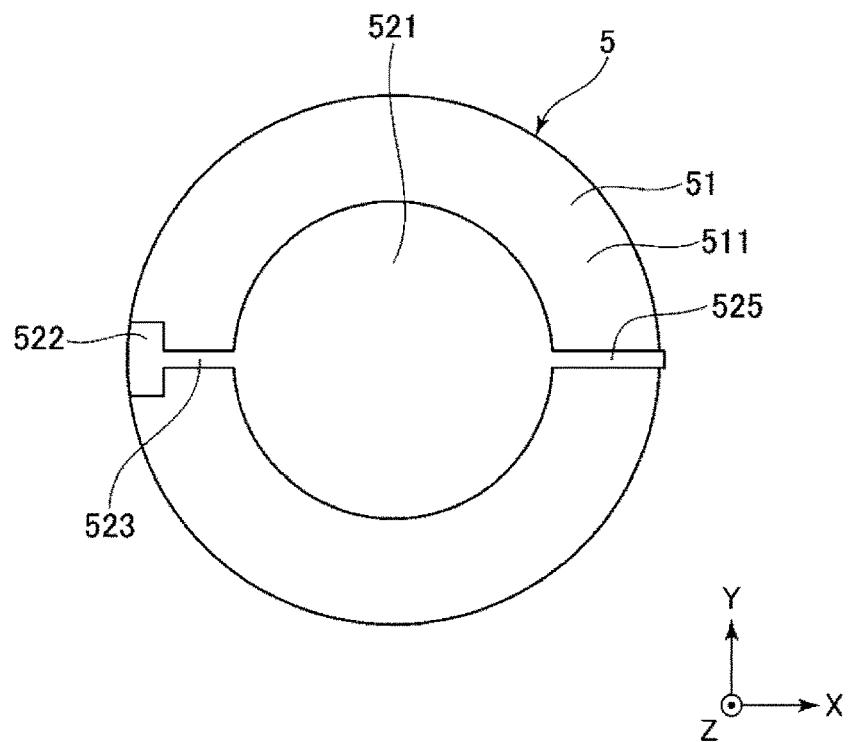
FIG. 7 is a plan view showing an upper surface of a resonator element, as viewed from the top side in FIG. 6.
Figure 8:
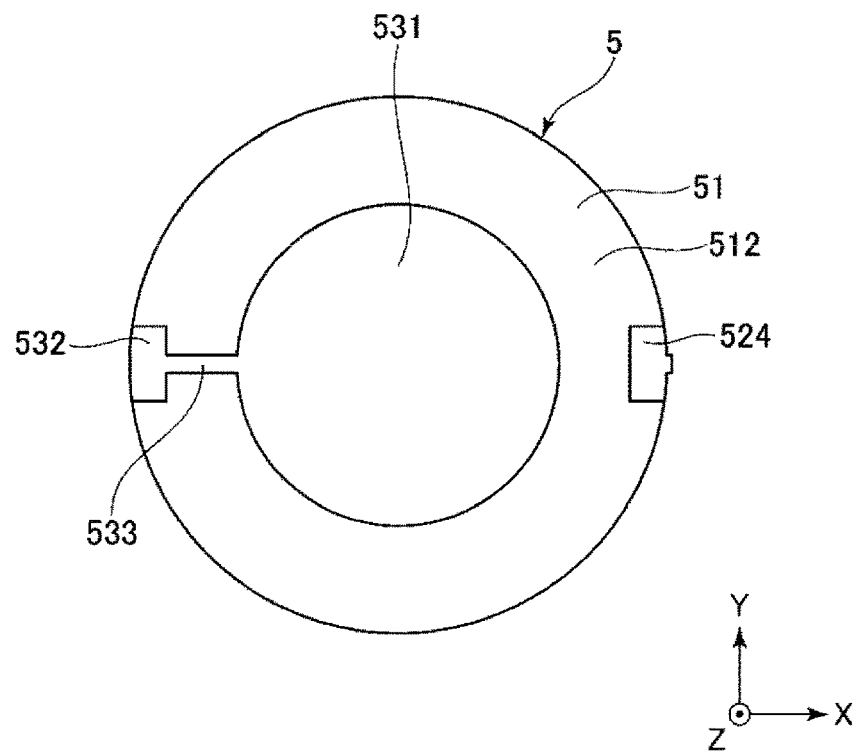
FIG. 8 is a perspective view showing a lower surface of the resonator element, as viewed from the top side in FIG. 6.
Figure 9:
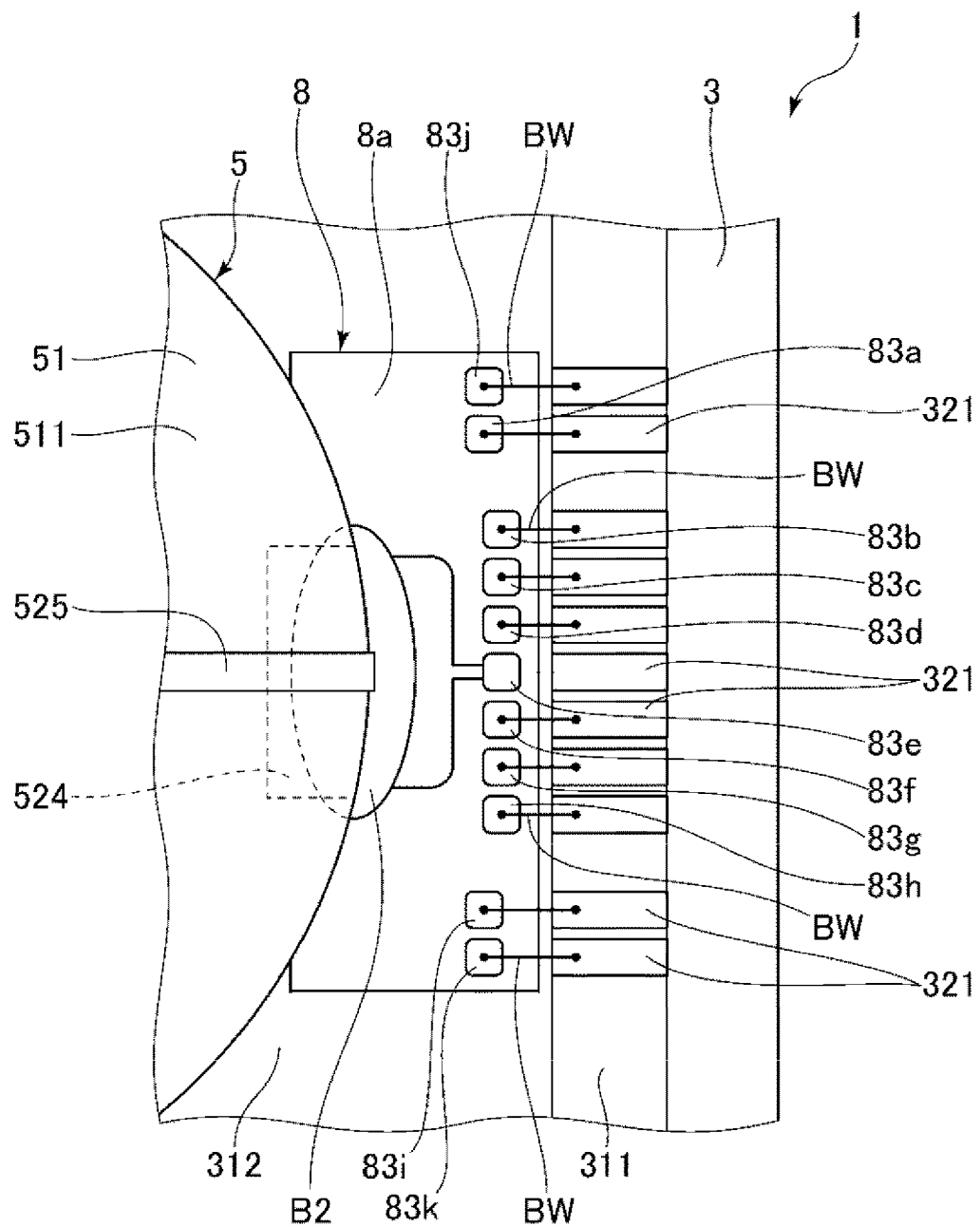
FIG. 9 is a plan view showing one temperature control element.

FIG. 6 is a cross-sectional view showing an oscillator according to a second embodiment. FIG. 7 is a plan view showing an upper surface of a resonator element, as viewed from the top side in FIG. 6. FIG. 8 is a perspective view showing a lower surface of the resonator element, as viewed from the top side in FIG. 6. FIG. 9 is a plan view showing one temperature control element.

This embodiment is similar to the first embodiment except for having two temperature control elements 7, 8. In the description below, this embodiment is described mainly in terms of its difference from the foregoing embodiment, and the description of similar elements is omitted. In FIGS. 6 to 9, the same components as those in the foregoing embodiment are denoted by the same reference signs.

The oscillator 1 shown in FIG. 6 has two temperature control elements 7, 8 accommodated in the package 2. As the two temperature control elements 7, 8 are provided, the resonator element 5 can be heated more efficiently.

As shown in FIGS. 7 and 8, the resonator element 5 has a third coupling electrode 524, and a third extraction electrode 525 coupling the first excitation electrode 521 and the third coupling electrode 524 together, which are arranged at the lower surface 512 of the quartz crystal substrate 51. The third coupling electrode 524 is located on the other side of the second excitation electrode 531 from the second coupling electrode 532. That is, the second coupling electrode 532 is located at an end on the negative side on the X-axis. The third coupling electrode 524 is located at an end on the positive side on the X-axis.

As shown in FIG. 6, the temperature control elements 7, 8 overlap the resonator element 5 and are located opposite each other via the center of the resonator element 5, as viewed in a plan view. The resonator element 5 is attached at its end on the negative side on the X-axis to the upper surface 7a of the temperature control element 7 via an electrically conductive bonding member B1 and is attached at its end on the positive side on the X-axis to an upper surface 8a of the temperature control element 8 via an electrically conductive bonding member B2. Thus, the temperature control element 7 can heat the resonator element 5 from the end on the negative side on the X-axis and the temperature control element 8 can heat the resonator element 5 from the end on the positive side on the X-axis. That is, the resonator element 5 can be heated from its both ends and therefore can be heated more uniformly. Particularly, the bonding member B1 is bonded to the second coupling electrode 532, and the bonding member B2 is bonded to the third coupling electrode 524. Therefore, the heat of the temperature control element 7 is transferred from the side of the second excitation electrode 531 to the quartz crystal substrate 51, and the heat of the temperature control element 8 is transferred from the side of the first excitation electrode 521 to the quartz crystal substrate 51. Thus, the quartz crystal substrate 51 can be heated more uniformly. Also, the resonator element 5 is supported by the two temperature control elements 7, 8 and therefore becomes stable in attitude.

However, the arrangement of the temperature control element 8 is not particularly limited, provided that the temperature control element 8 is located at a position not overlapping the temperature control element 7, as viewed in a plan view.

The temperature control element 8 has a temperature sensor 81 and a heat generation circuit 82, similarly to the temperature control element 7. As an example of the circuit configuration of the temperature control element 8, the configuration shown in FIG. 4 can be employed. As shown in FIG. 9, a plurality of electrode pads 83a, 83b, 83c, 83d, 83e, 83f, 83g, 83h, 83i, 83j, 83k are arranged at the upper surface 8a of the temperature control element 8. The electrode pads 83a, 83i function as the power supply terminal VD shown in FIG. 4. The electrode pads 83b, 83c, 83d, 83f, 83g, 83h function as the grounding terminal VS shown in FIG. 4. The electrode pad 83j functions as the output terminal TS shown in FIG. 4. The electrode pad 83k functions as the input terminal G shown in FIG. 4.

The electrode pad 83e is a dummy electrode pad not electrically coupled to the temperature sensor 81 and the heat generation circuit 82. The electrode pad 83e is not electrically coupled to the internal terminal 321 of the base substrate 3, either. That is, the bonding wire BW coupling the electrode pad 83e and the internal terminal 321 together is omitted. This can restrain heat transfer between the temperature control element 8 and the base substrate 3.

The electrode pad 83e is coupled to the third coupling electrode 524 of the resonator element 5 via the bonding member B2. Therefore, the temperature control element 8 and the resonator element 5 are coupled together via the bonding member B2, and the temperature control element 8 and the resonator element 5 are thermally coupled together. Thus, the resonator element 5 can be efficiently heated by the temperature control element 8.

As described above, the oscillator 1 according to this embodiment has the temperature control element 8 as a second temperature control element installed at the base substrate 3. The resonator element 5 overlaps the temperature control element 8 at a position not overlapping the temperature control element 7, as viewed in a plan view. Thus, the resonator element 5 can be heated by the temperature control elements 7, 8 and therefore can be heated efficiently. Also, the resonator element 5 is supported by the two temperature control elements 7, 8 and therefore becomes stable in attitude.

The second embodiment can achieve effects similar to those of the first embodiment.

Third Embodiment

Figure 10:
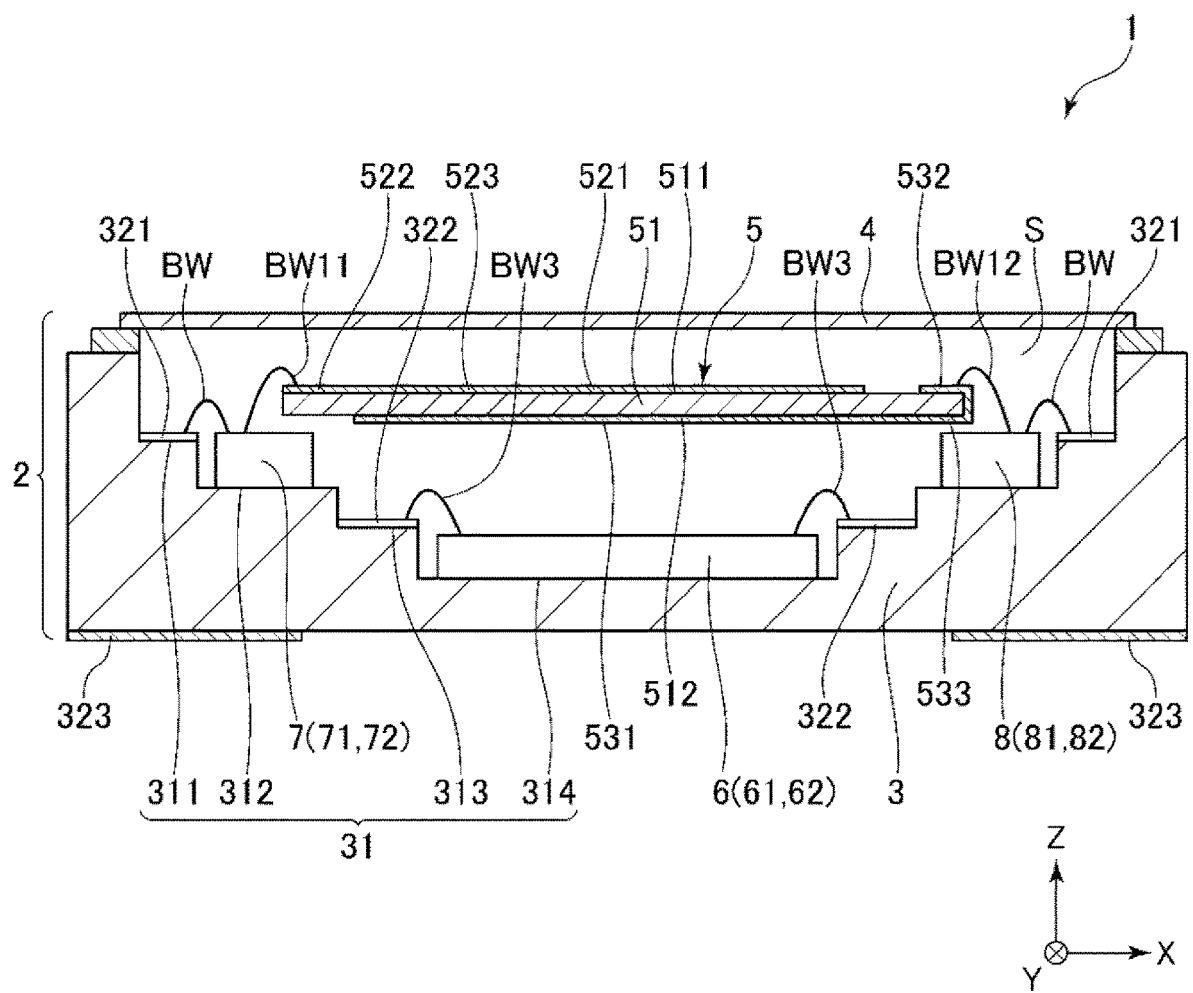
FIG. 10 is a cross-sectional view showing an oscillator according to a third embodiment.
Figure 11:
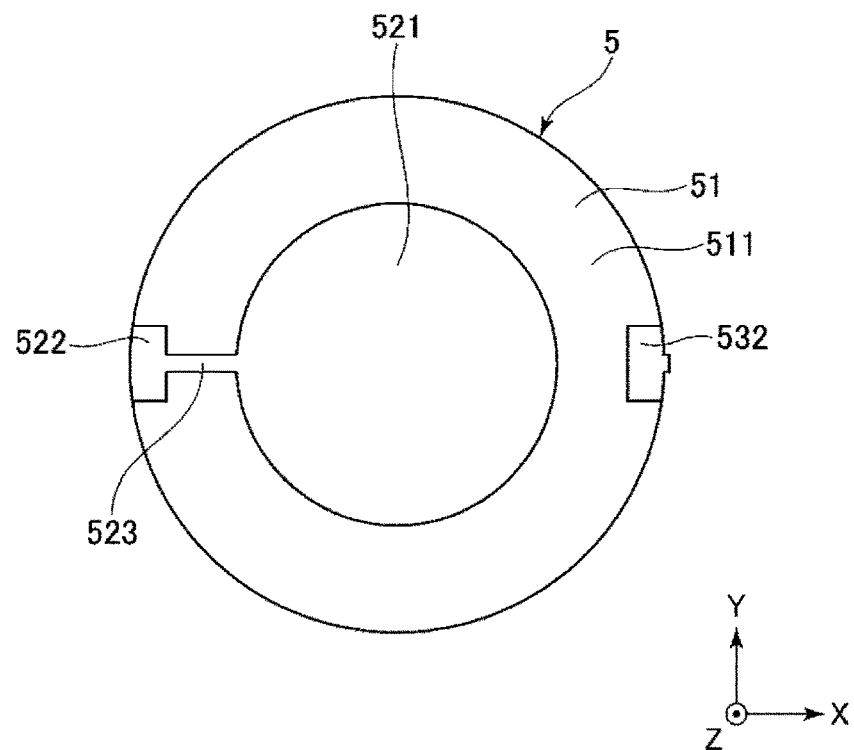
FIG. 11 is a plan view showing an upper surface of a resonator element, as viewed from the top side in FIG. 10.
Figure 12:
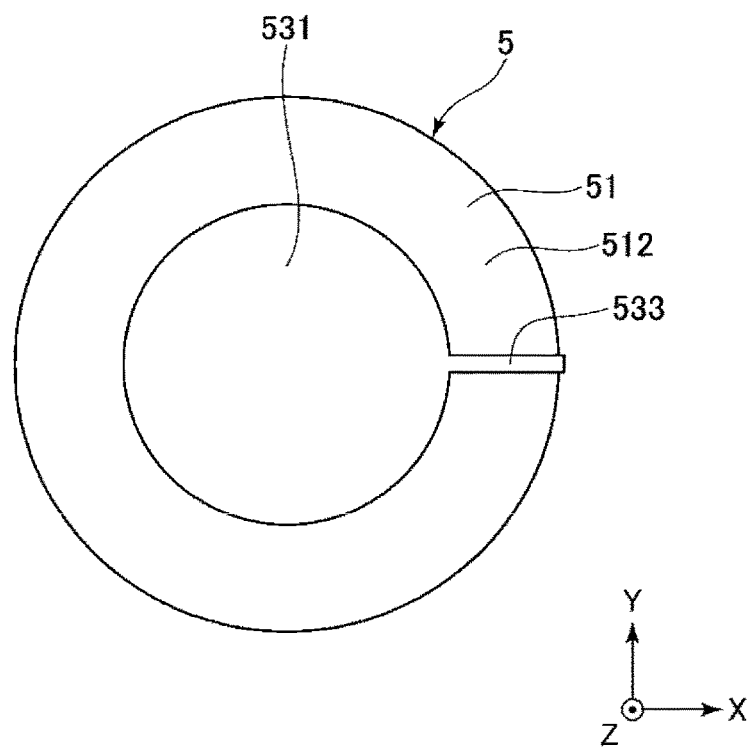
FIG. 12 is a perspective view showing a lower surface of the resonator element, as viewed from the top side in FIG. 10.
Figure 13:
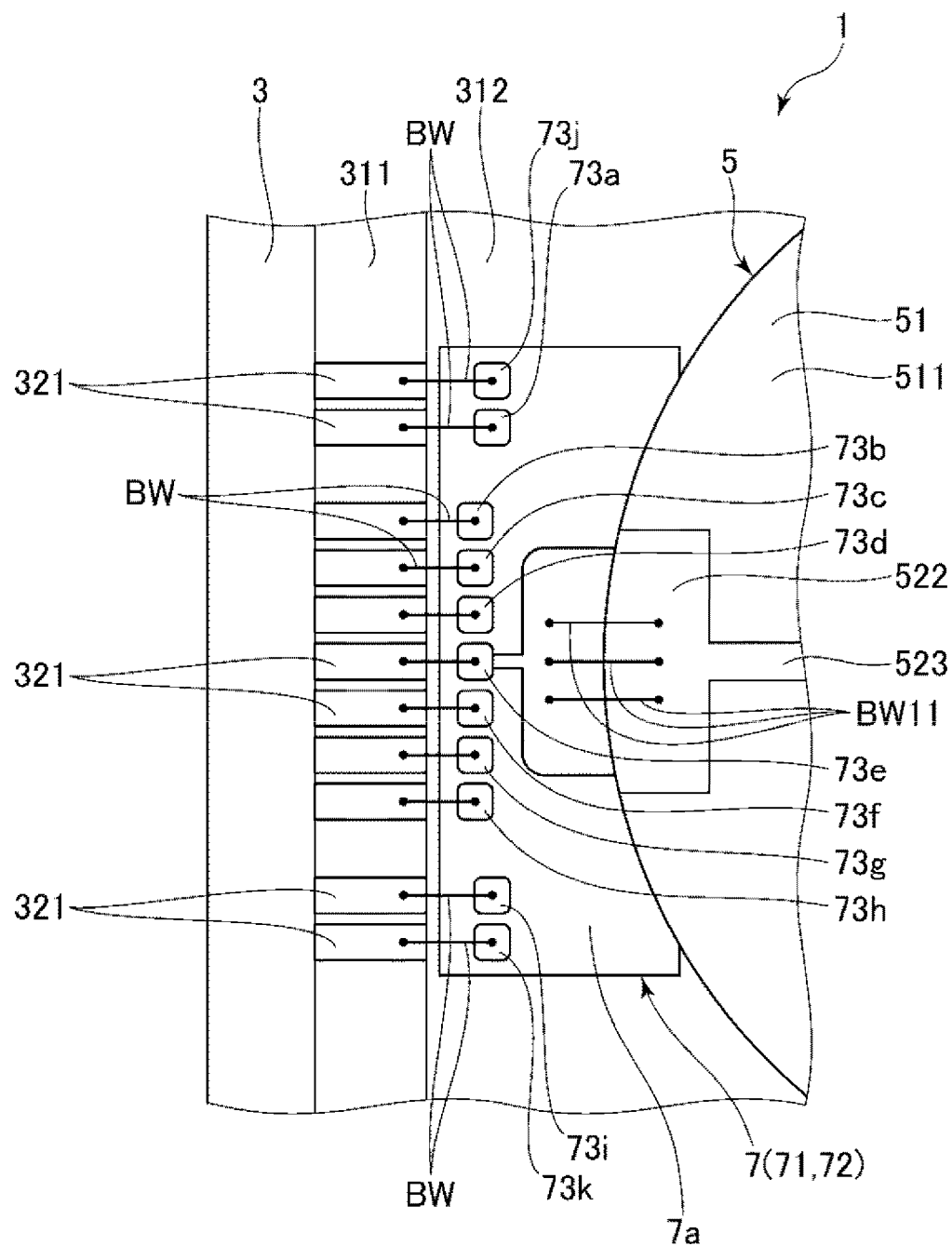
FIG. 13 is a plan view showing one temperature control element.
Figure 13:
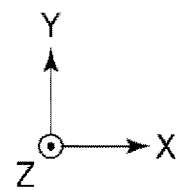
Figure 14:
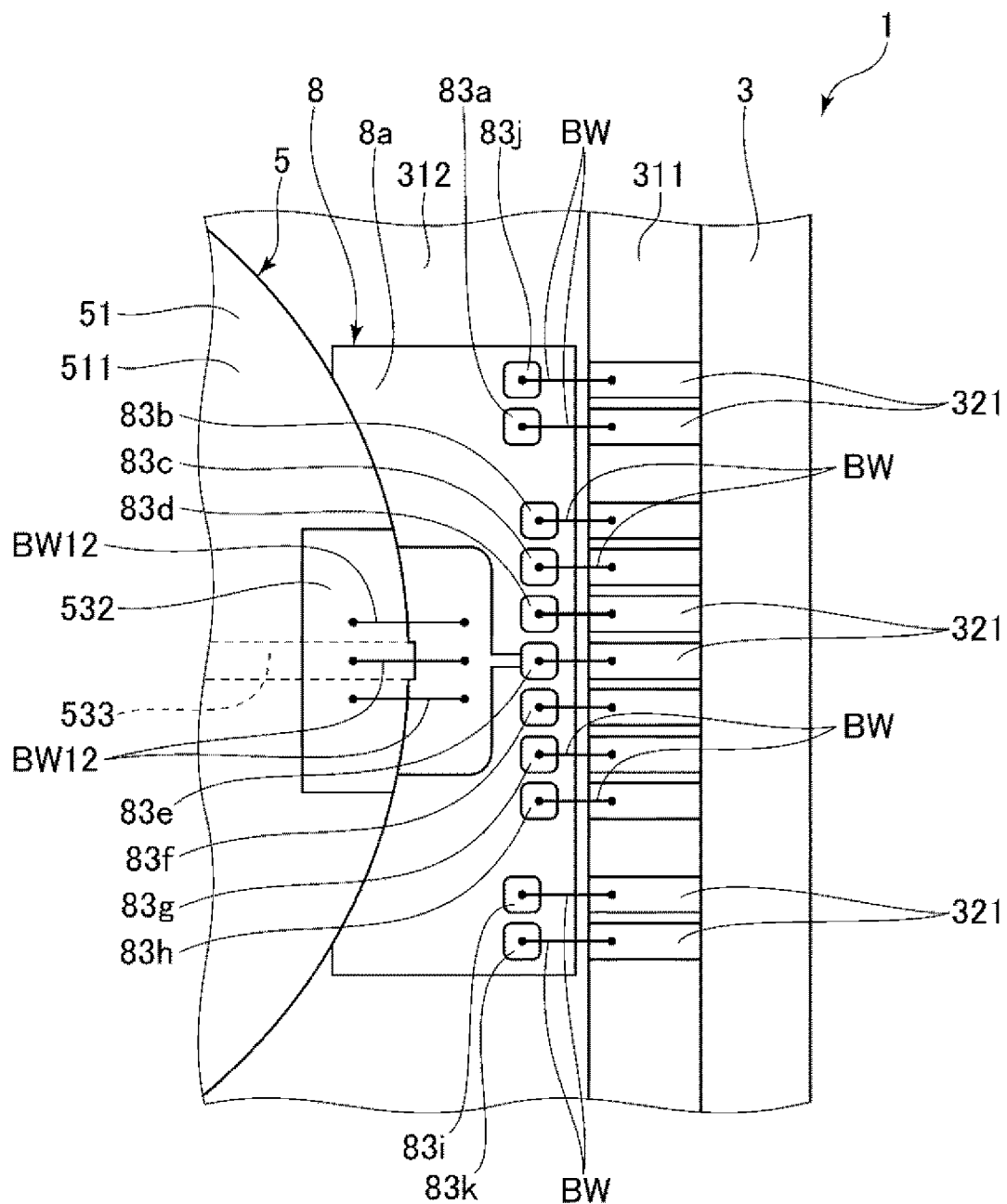
FIG. 14 is a plan view showing the other temperature control element.
Figure 15:
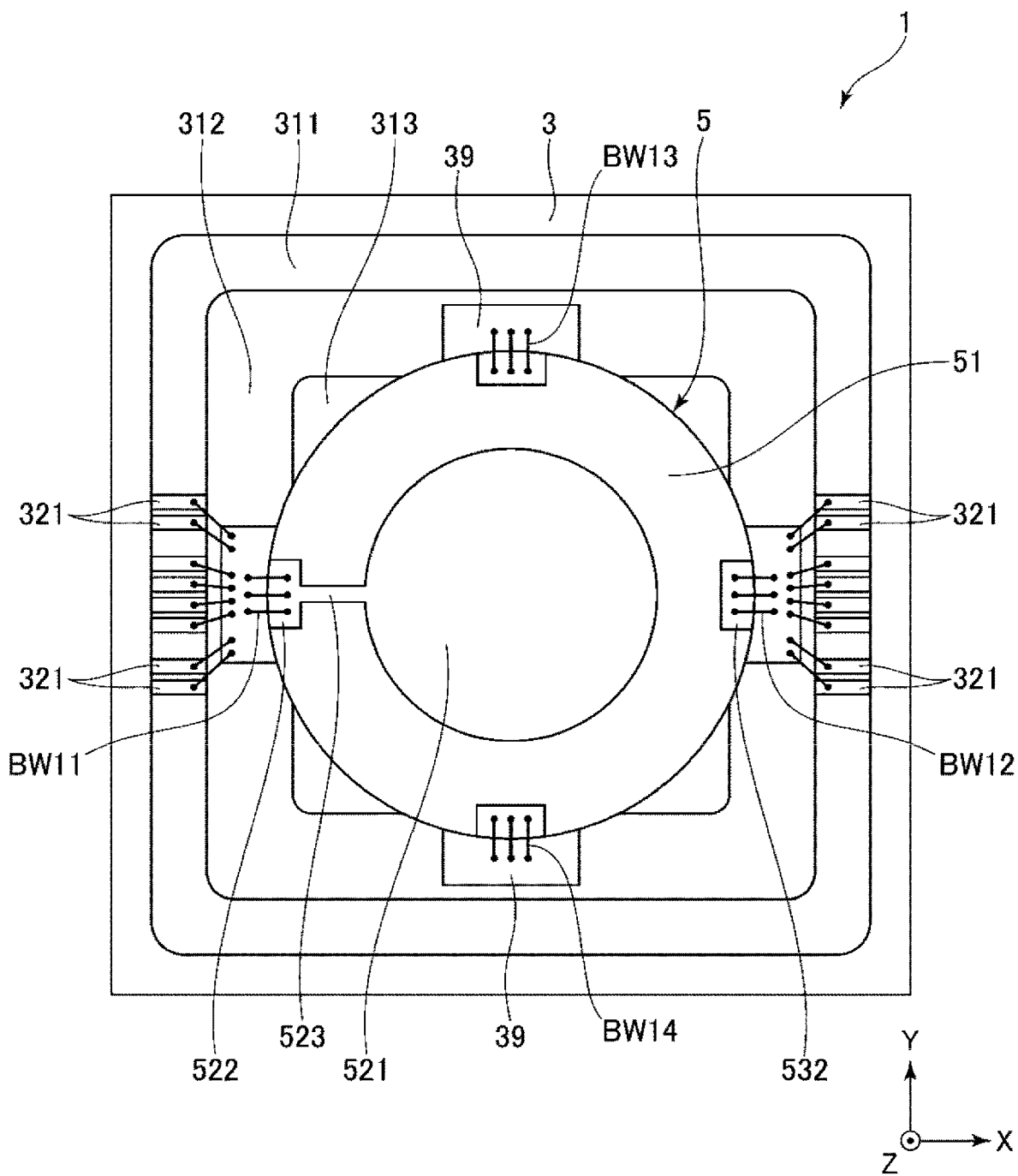
FIG. 15 is a plan view showing a modification example of the oscillator shown in FIG. 10.

FIG. 10 is a cross-sectional view showing an oscillator according to a third embodiment. FIG. 11 is a plan view showing an upper surface of a resonator element, as viewed from the top side in FIG. 10. FIG. 12 is a perspective view showing a lower surface of the resonator element, as viewed from the top side in FIG. 10. FIG. 13 is a plan view showing one temperature control element. FIG. 14 is a plan view showing the other temperature control element. FIG. 15 is a plan view showing a modification example of the oscillator shown in FIG. 10.

This embodiment is similar to the second embodiment except for the method for coupling the temperature control elements 7, 8 and the resonator element 5. In the description below, this embodiment is described mainly in terms of its difference from the foregoing embodiments, and the description of similar elements is omitted. In FIGS. 10 to 15, the same components as those in the foregoing embodiments are denoted by the same reference signs.

As shown in FIG. 10, in the oscillator 1 according to this embodiment, the resonator element 5 is hung by bonding wires BW11, BW12 and is suspended in the air inside an accommodation space S.

As shown in FIGS. 11 and 12, the second coupling electrode 532 of the resonator element 5 is located at the upper surface 511 of the quartz crystal substrate 51. The second coupling electrode 532 is also located on the other side of the first excitation electrode 521 from the first coupling electrode 522. That is, the first coupling electrode 522 is located at an end on the negative side on the X-axis and the second coupling electrode 532 is located at an end on the positive side on the X-axis.

As shown in FIGS. 13 and 14, the resonator element 5 is attached to the upper surface 7a of the temperature control element 7 via the bonding wire BW11 and attached to the upper surface 8a of the temperature control element 8 via the bonding wire BW12. As described above, the resonator element 5 is hung by the bonding wires BW11, BW12 and supported in the state of being suspended in the air by the temperature control elements 7, 8. Thus, a stress from the package 2 is not easily transmitted to the resonator element 5 and the resonance property of the resonator element 5 becomes stable. The heat of the temperature control element 7 is transferred to the resonator element 5 via the bonding wire BW11. The heat of the temperature control element 8 is transferred to the resonator element 5 via the bonding wire BW12.

The bonding wire BW11 couples the first coupling electrode 522 and the electrode pad 73e together. The electrode pad 73e is electrically coupled to the internal terminal 321 via the bonding wire BW. Meanwhile, the bonding wire BW12 couples the second coupling electrode 532 and the electrode pad 83e together. The electrode pad 83e is electrically coupled to the internal terminal 321 via the bonding wire BW. Thus, the resonator element 5 and the circuit element 6 are electrically coupled together.

The third embodiment, too, can achieve effects similar to those of the first embodiment. Although the resonator element 5 in this embodiment is hung at two positions by the bonding wires BW11, BW12, this is not limiting. For example, the resonator element 5 may be hung at four positions spaced apart from each other by 90 degrees by bonding wires BW11, BW12, BW13, BW14, as shown in FIG. 15. In the illustrated configuration, a support pole 39 for coupling the bonding wires BW13, BW14 is provided at the base substrate 3.

Fourth Embodiment

Figure 16:
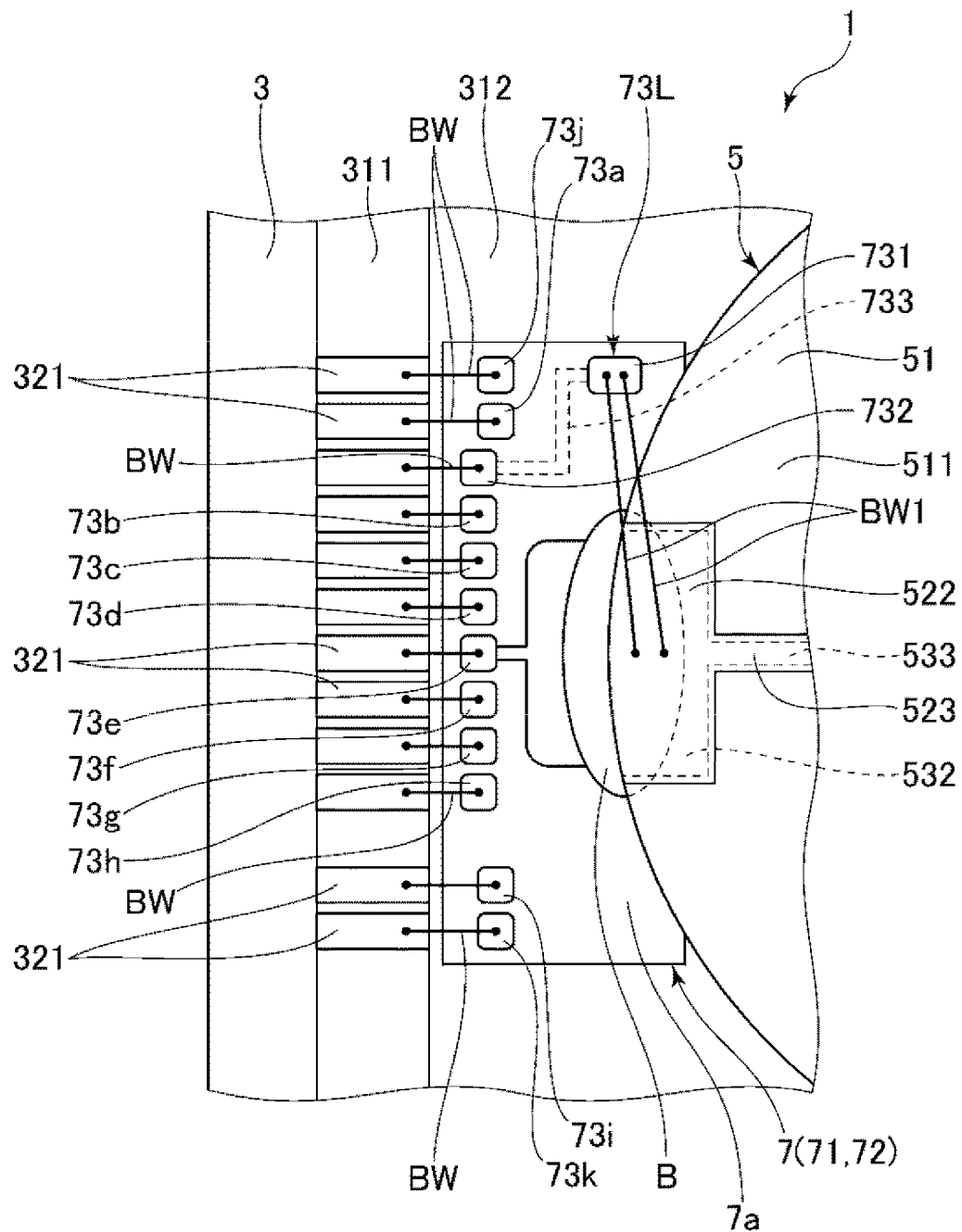
FIG. 16 is a plan view showing a temperature control element of an oscillator according to a fourth embodiment.

FIG. 16 is a plan view showing a temperature control element provided in an oscillator according to a fourth embodiment.

This embodiment is similar to the first embodiment except that the configuration of the electrode pad 73L is different. In the description below, this embodiment is described mainly in terms of its difference from the foregoing embodiments, and the description of similar elements is omitted. In FIG. 16, the same components as those in the foregoing embodiments are denoted by the same reference signs.

As shown in FIG. 16, the electrode pad 73L in this embodiment has a first part 731 and a second part 732 arranged separately from each other at the top of the upper surface 7a. The bonding wire BW1 is coupled to the first part 731. The bonding wire BW is coupled to the second part 732. The first part 731 and the second part 732 are electrically coupled together via a wiring 733 formed inside the temperature control element 7. Such a configuration increases the degree of freedom in the arrangement of the electrode pad 73L and makes it easy to design the oscillator 1.

The fourth embodiment, too, can achieve effects similar to those of the first embodiment. Although the wiring 733 coupling the first part 731 and the second part 732 together is formed inside the temperature control element 7 in this embodiment, this is not limiting. The wiring 733 may be formed at the upper surface 7a.

Fifth Embodiment

Figure 17:
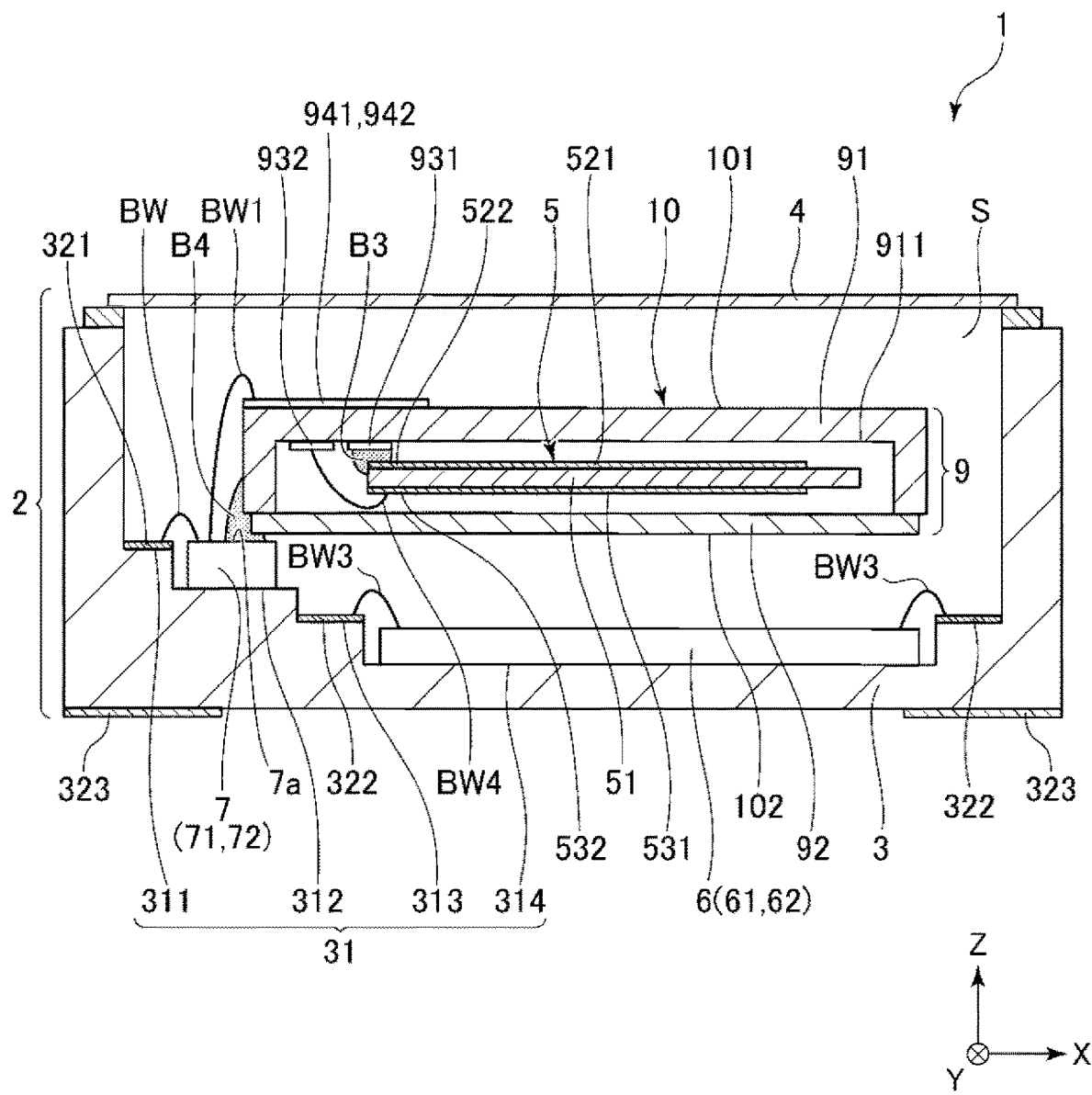
FIG. 17 is a cross-sectional view showing an oscillator according to a fifth embodiment.
Figure 18:
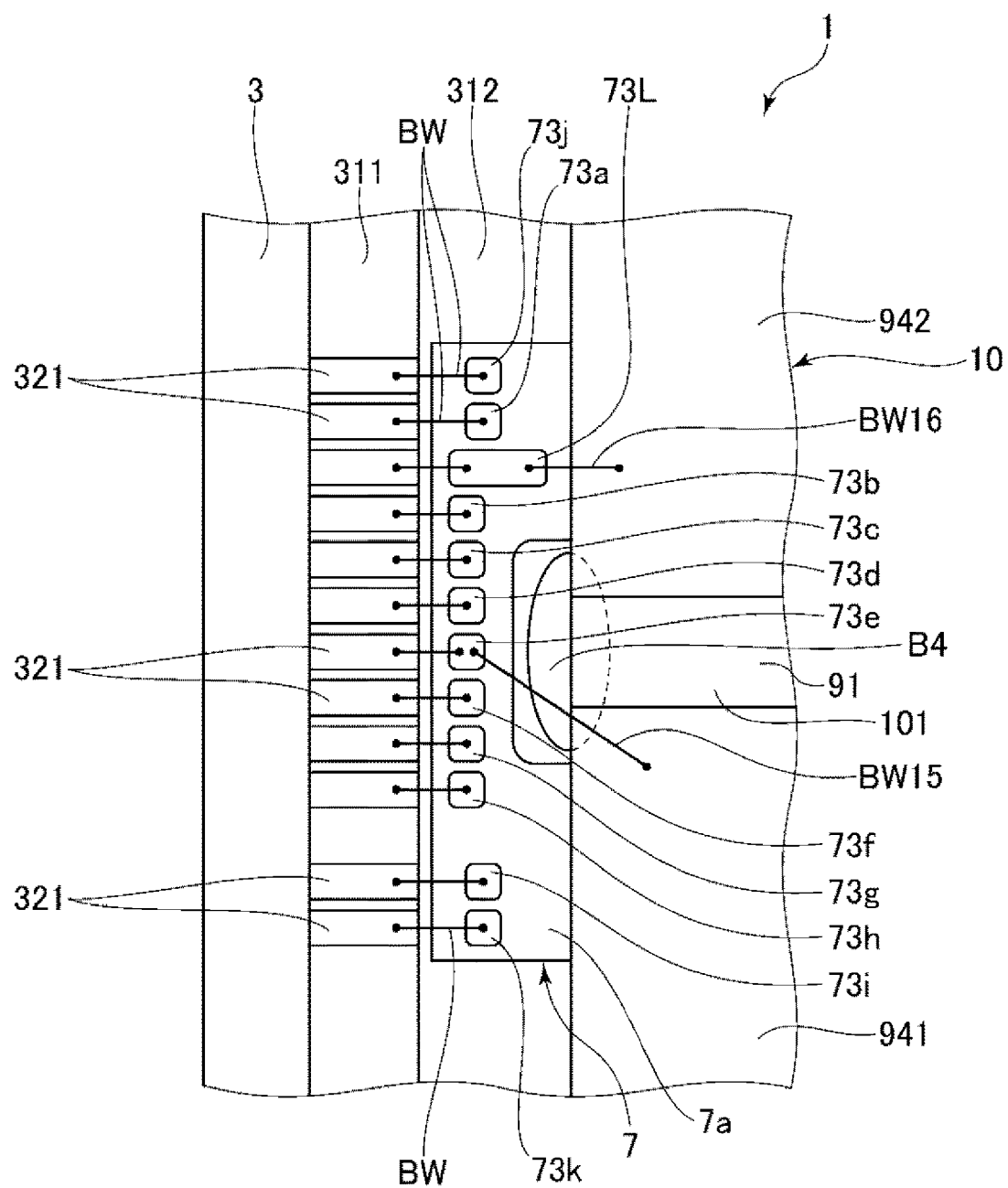
FIG. 18 is a plan view showing the oscillator in FIG. 17.
Figure 18:
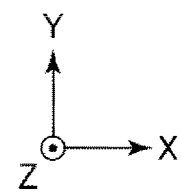

FIG. 17 is a cross-sectional view showing an oscillator according to a fifth embodiment. FIG. 18 is a plan view showing the oscillator shown in FIG. 17.

This embodiment is similar to the first embodiment except that the resonator element 5 is accommodated in an inner package 9. In the description below, this embodiment is described mainly in terms of its difference from the foregoing embodiments, and the description of similar elements is omitted. In FIGS. 17 and 18, the same components as those in the foregoing embodiments are denoted by the same reference signs.

As shown in FIG. 17, the oscillator 1 according to this embodiment has: the package 2; and a resonator 10, the circuit element 6, and the temperature control element 7 accommodated in the package 2. The resonator 10 has the inner package 9 and the resonator element 5 accommodated in the inner package 9.

The inner package 9 has a base substrate 91 having a recess part 911 opening at a lower surface, and a lid 92 bonded to the lower surface of the base substrate 91 in such a way as to close the opening of the recess part 911. For example, the base substrate 91 is formed of a ceramic material such as alumina. The lid 92 is formed of a metal material such as Kovar. Internal terminals 931, 932 are arranged at a bottom surface of the recess part 911. Also, external terminals 941, 942 electrically coupled to the internal terminals 931, 932 via a wiring, not illustrated, formed inside the base substrate 91, are arranged at an upper surface of the base substrate 91.

The resonator element 5 is attached to the bottom surface of the recess part 911 via an electrically conductive bonding member B3. The first coupling electrode 522 of the resonator element 5 is electrically coupled to the internal terminal 931 via the bonding member B3. The second coupling electrode 532 is electrically coupled to the internal terminal 932 via a bonding wire BW4.

The resonator 10 has an upper surface 101 formed by the upper surface of the base substrate 91, and a lower surface 102 formed by a lower surface of the lid 92 and in front-back relation with the upper surface 101. The resonator 10 is arranged in such a way that its lower surface 102 faces the temperature control element 7. The lower surface 102 is attached to the upper surface 7a of the temperature control element 7 via an electrically conductive bonding member B4. Therefore, the temperature control element 7 and the resonator 10 are thermally coupled together via the bonding member B4. The bonding member B4 is not configured to electrically couple the temperature control element 7 and the resonator 10 together and therefore need not be electrically conductive.

As shown in FIG. 18, the electrode pad 73e arranged at the upper surface 7a of the temperature control element 7 and the external terminal 941 of the resonator 10 are electrically coupled together via a bonding wire BW15. The electrode pad 73L and the external terminal 942 are electrically coupled together via a bonding wire BW16.

As described above, the oscillator 1 has: the base substrate 3 having the internal terminal 321 as a first electrode; the temperature control element 7 installed at the base substrate 3 and having the electrode pads 73e, 73L as first pads electrically coupled to the internal terminal 321; the resonator 10 including the resonator element 5 and the inner package 9 as a container accommodating the resonator element 5, the resonator 10 having the external terminals 941, 942 as first terminals at the upper surface 101 as a first surface, the resonator 10 being attached to the temperature control element 7 at the side of the lower surface 102 as a second surface in front-back relation with the upper surface 101; and at least one bonding wire WB15, BW16 as a first bonding wire coupling the external terminals 941, 942 and the electrode pads 73e, 73L together. Since the internal terminal 321 and the resonator 10 are coupled together via the relay of the electrode pads 73e, 73L in this way, heat transfer between the resonator element 5 and the base substrate 3 is restrained, as in the first embodiment. Therefore, the temperature of the resonator element 5 becomes stable and the oscillator 1 in which the temperature of the resonator element 5 can be controlled with higher accuracy is provided.

The fifth embodiment, too, can achieve effects similar to those of the first embodiment.

Sixth Embodiment

Figure 19:
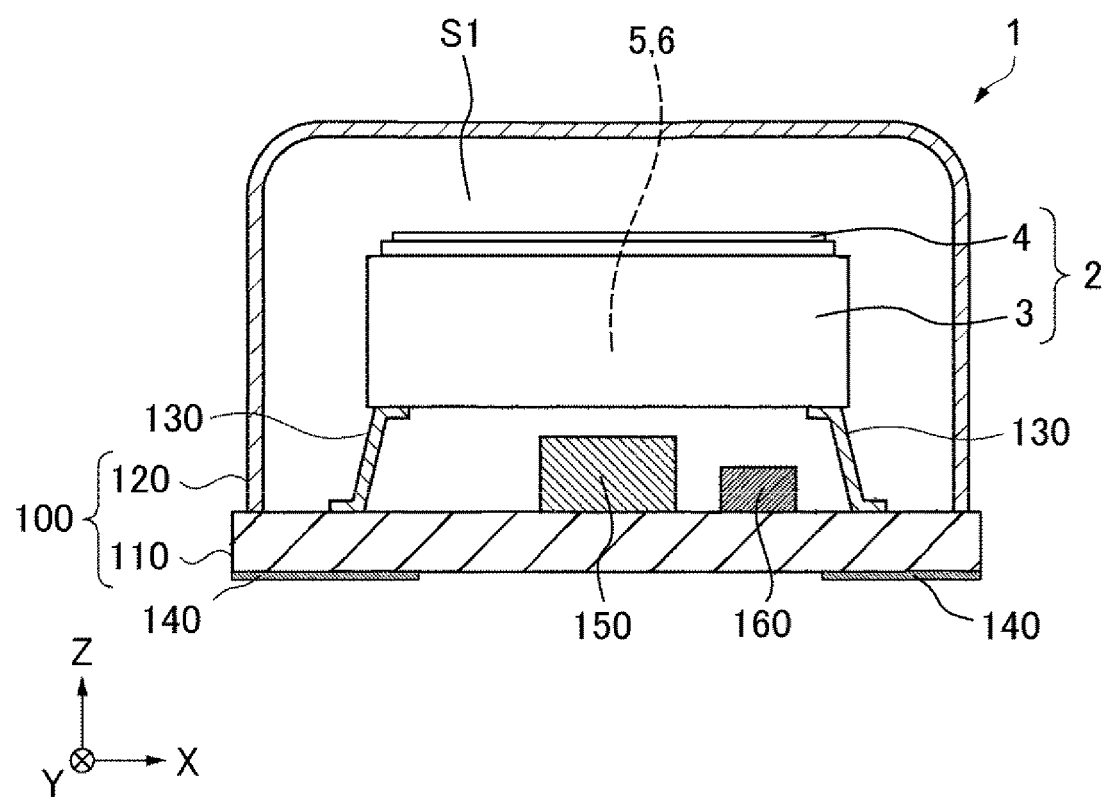
FIG. 19 is a cross-sectional view showing an oscillator according to a sixth embodiment.

FIG. 19 is a cross-sectional view showing an oscillator according to a sixth embodiment.

This embodiment is similar to the first embodiment except for further having an outer package 100 accommodating the package 2. In the description below, this embodiment is described mainly in terms of its difference from the foregoing embodiments, and the description of similar elements is omitted. In FIG. 19, the same components as those in the foregoing embodiments are denoted by the same reference signs.

The oscillator 1 shown in FIG. 19 has the outer package 100 accommodating the package 2. The outer package 100 has a mounted circuit board 110 and a lid 120 bonded to an upper surface of the mounted circuit board 110. An airtight accommodation space S1 is formed inside the outer package 100. The package 2 is accommodated inside the accommodation space S1. The package 2 is mounted at the mounted circuit board 110 via a lead frame 130. The package 2 and the mounted circuit board 110 are electrically coupled together via the lead frame 130. At a lower surface of the mounted circuit board 110, a mount terminal 140 for mounting the oscillator 1 at a substrate or the like is provided. In the accommodation space S1, a circuit element 150 and a circuit component 160 such as a plurality of capacitors and resistors, arranged at the upper surface of the mounted circuit board 110, are accommodated. The circuit element 150 and the circuit component 160 may be provided as a part of the circuit element 6 or may form another circuit than the circuit element 6.

The accommodation space S1 is in a depressurized state and preferably in a state closer to vacuum. However, the ambience in the accommodation space S1 is not particularly limited and may be, for example, an ambience in which an inert gas such as nitrogen, argon or helium is enclosed, or may be an atmospheric-pressure state or pressurized state instead of the depressurized state.

The material forming the mounted circuit board 110 is not particularly limited and may be, for example, an insulative glass epoxy resin, ceramic or the like. The wiring and terminal provided at the mounted circuit board 110 can be formed by a method of etching a copper foil formed over the entire surface of a substrate, by a method of screen-printing and firing a metal wiring material such as tungsten or molybdenum at the top of a substrate and then plating the resulting material with nickel, gold or the like, or by other similar methods. The material forming the lid 120 is not particularly limited and may be, for example, a metal material, resin material or the like, or may be a composite material of these. Using a metal material from among these materials can provide a shielding effect for the outer package 100, that is, blocking or attenuating an external electromagnetic noise. As the material forming the lead frame 130, for example, an iron-based alloy with a low thermal conductivity plated with nickel, such as an iron-nickel alloy like alloy 42, may be preferably used.

Such an oscillator 1 can achieve effects similar to those of the first embodiment.

Seventh Embodiment

Figure 20:
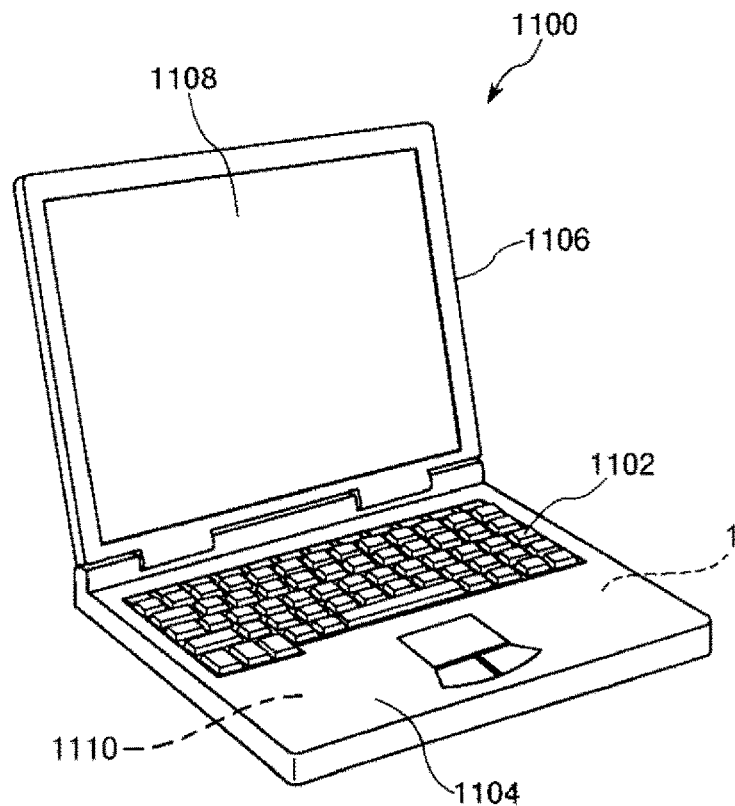
FIG. 20 is a perspective view showing a personal computer according to a seventh embodiment.

FIG. 20 is a perspective view showing a personal computer according to a seventh embodiment.

A personal computer 1100 as an electronic apparatus shown in FIG. 20 is made up of a main body 1104 having a keyboard 1102, and a display unit 1106 having a display 1108. The display unit 1106 is supported in such a way as to be able to pivot about the main body 1104 via a hinge structure. The oscillator 1 is built in such a personal computer 1100. The personal computer 1100 also has a signal processing circuit 1110 performing arithmetic processing for control of the keyboard 1102 and the display 1108 or the like. The signal processing circuit 1110 operates, based on an oscillation signal outputted from the oscillator 1.

In this way, the personal computer 1100 as an electronic apparatus has the oscillator 1, and the signal processing circuit 1110 performing signal processing based on an output signal (oscillation signal) from the oscillator 1. Therefore, the personal computer 1100 can gain the effects of the oscillator 1 and can achieve high reliability.

The electronic apparatus having the oscillator 1 may be not only the personal computer 1100 but also, for example, a digital still camera, smartphone, tablet terminal, timepiece including smartwatch, inkjet ejection device such as inkjet printer, wearable terminal such as HMD (head-mounted display), laptop personal computer, television, video camera, video tape recorder, car navigation device, pager, electronic organizer including one with a communication function, electronic dictionary, electronic calculator, electronic game device, word processor, workstation, videophone, security monitor, electronic binoculars, POS terminal, medical equipment such as electronic body thermometer, blood pressure monitor, blood sugar monitor, electrocardiograph, ultrasonic diagnostic device or electronic endoscope, fishfinder, various measuring devices, instruments of vehicle, aircraft or ship, mobile terminal base station, flight simulator, and the like.

Eighth Embodiment

Figure 21:
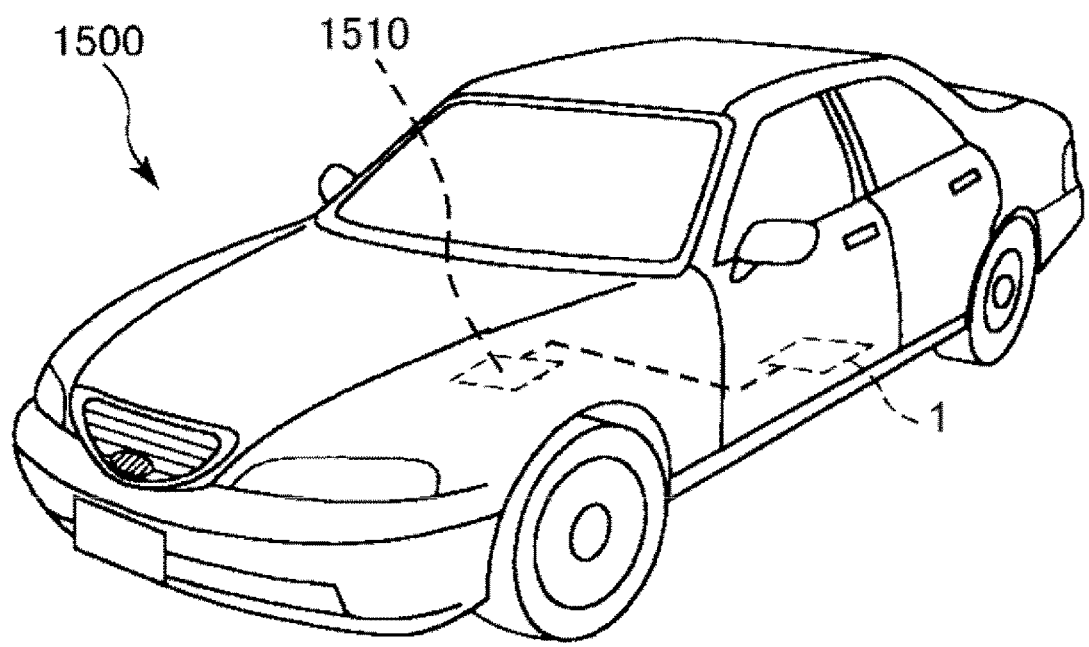
FIG. 21 is a perspective view showing an automobile according to an eighth embodiment.

FIG. 21 is a perspective view showing an automobile according to an eighth embodiment.

As shown in FIG. 21, the oscillator 1 and a signal processing circuit 1510 operating based on an oscillation signal outputted from the oscillator 1 are built in an automobile 1500 as a vehicle. The oscillator 1 and the signal processing circuit 1510 can be broadly applied, for example, to a keyless entry system, immobilizer, car navigation system, car air-conditioning, anti-lock braking system (ABS), airbags, tire pressure monitoring system (TPMS), engine control, battery monitor for hybrid car or electric vehicle, and electronic control unit (ECU) such as vehicle attitude control system.

In this way, the automobile 1500 as a vehicle has the oscillator 1 and the signal processing circuit 1510 operating based on an output signal (oscillation signal) from the oscillator 1. Therefore, the automobile 1500 can gain the effects of the oscillator 1 and can achieve high reliability.

The vehicle having the oscillator 1 may be not only the automobile 1500 but also, for example, a robot, drone, two-wheeled vehicle, aircraft, ship, electric train, rocket, spacecraft, and the like.

The oscillator, the electronic apparatus, and the vehicle according to the present disclosure have been described above, based on the illustrated embodiments. However, the present disclosure is not limited to these embodiments. The configuration of each part can be replaced by any configuration having a similar function. Also, any other arbitrary component may be added to the present disclosure.

What is claimed is:

1. An oscillator comprising:
a base substrate having a first electrode;
a temperature control element mounted on the base substrate and having a first pad electrically coupled to the first electrode;
a resonator element having a first major surface and a second major surface in front-back relation with the first major surface, and mounted on the temperature control element in such a way that the second major surface faces the temperature control element;
at least one first bonding wire coupling the first major surface and the first pad together; and
at least one second bonding wire electrically coupling the first pad and the first electrode together such that the first pad acts a single relay electrode pad that connects the first bonding wire and the second bonding wire.

2. The oscillator according to claim 1, wherein
a number of the second bonding wires is fewer than a number of the first bonding wires.

3. The oscillator according to claim 1, wherein
the temperature control element has a second pad, and
the second major surface is bonded to the second pad via an electrically conductive bonding member.

4. The oscillator according to claim 3, wherein
the temperature control element has a third pad to which a constant voltage is applied, and
the third pad is arranged between the first pad and the second pad in a plan view.

5. The oscillator according to claim 4, wherein
the first pad has a larger area than the third pad in a plan view.

6. The oscillator according to claim 3, wherein
the temperature control element has:
a temperature-sensitive element;
a third pad to which a high potential-side power supply voltage is applied;
a fourth pad to which a low potential-side power supply voltage is applied;
a fifth pad outputting a signal from the temperature-sensitive element; and
a sixth pad to which a control voltage is applied,
one of the third pad, the fourth pad, and the fifth pad is arranged between the first pad and the sixth pad in a plan view, and
one of the third pad, the fourth pad, and the fifth pad is arranged between the second pad and the sixth pad in a plan view.

7. The oscillator according to claim 1, further comprising:
a second temperature control element mounted on the base substrate, wherein
the resonator element overlaps the second temperature control element at a position not overlapping the temperature control element in a plan view.

8. An electronic apparatus comprising:
the oscillator according to claim 1; and
a signal processing circuit performing signal processing based on an output signal from the oscillator.

9. A vehicle comprising:
the oscillator according to claim 1; and
a signal processing circuit performing signal processing based on an output signal from the oscillator.

10. An oscillator comprising:
a base substrate having a first electrode;
a temperature control element mounted on the base substrate and having a first pad electrically coupled to the first electrode;
a resonator including a resonator element and a container that accommodates the resonator element, the resonator having a first terminal at a first surface, the resonator being mounted on the temperature control element at the side of a second surface in a front-back relation with the first surface, wherein the container defines an enclosed space that separates the resonator element from the base substrate and the temperature control element; and
at least one bonding wire coupling the first terminal and the first pad together.

* * * * *